(12) United States Patent  
Maekawa

(10) Patent No.: US 10,215,815 B2
(45) Date of Patent: Feb. 26, 2019

(54) POWER SUPPLY MONITORING DEVICE, ELECTRONIC APPARATUS, AND POWER SUPPLY MONITORING METHOD

(71) Applicant: Sony Corporation, Tokyo (JP)

(72) Inventor: Tomoaki Maekawa, Tokyo (JP)

(73) Assignee: Sony Corporation, Tokyo (JP)

( * ) Notice: Subject to any disclaimer, the term of this patent is extended or adjusted under 35 U.S.C. 154(b) by 187 days.

(21) Appl. No.: 14/423,620

(22) PCT Filed: Jul. 5, 2013

(86) PCT No.: PCT/JP2013/004181
§ 371 (c)(1),
(2) Date: Feb. 24, 2015

(87) PCT Pub. No.: WO2014/038119
PCT Pub. Date: Mar. 13, 2014

(65) Prior Publication Data
US 2015/0301125 A1    Oct. 22, 2015

(30) Foreign Application Priority Data

Sep. 5, 2012   (JP) ................................. 2012-195356

(51) Int. Cl.
*G01R 31/42*    (2006.01)
*H02M 7/00*    (2006.01)
*G01R 31/40*    (2014.01)
*G01R 19/165*  (2006.01)
*H02M 7/06*    (2006.01)
*G06F 1/30*    (2006.01)

(52) U.S. Cl.
CPC ....... *G01R 31/40* (2013.01); *G01R 19/16538* (2013.01); *G06F 1/305* (2013.01); *H02M 7/06* (2013.01)

(58) Field of Classification Search
USPC ...................................... 324/764.01
See application file for complete search history.

(56) References Cited

U.S. PATENT DOCUMENTS

| 4,730,245 A * | 3/1988 | Sato ........................ H02H 3/24 |
| | | 363/128 |
| 4,980,791 A | 12/1990 | Alberkrack et al. |
| 5,661,348 A * | 8/1997 | Brown ................ H02M 1/4208 |
| | | 307/43 |
| 2014/0119084 A1* | 5/2014 | Ashikaga |

FOREIGN PATENT DOCUMENTS

| EP | 0 216 358 A2 | 4/1987 |
| JP | 11-202005 A | 7/1999 |
| JP | 2004-135392 A | 4/2004 |
| JP | 2010-261862 | 11/2010 |

* cited by examiner

*Primary Examiner* — Minh Q Phan
(74) *Attorney, Agent, or Firm* — Michael Best & Friedrich LLP

(57) ABSTRACT

A power supply monitoring device, comprising a monitoring circuit that includes a first charge comparing unit configured to generate a first comparison result based on a first pulsating signal, a second charge comparing unit configured to generate second comparison result based on a second pulsating signal, and a power interruption detection unit configured to output a detection signal based on whether the first and second comparison results indicate a supply of power has been interrupted.

13 Claims, 26 Drawing Sheets

[Fig. 1]
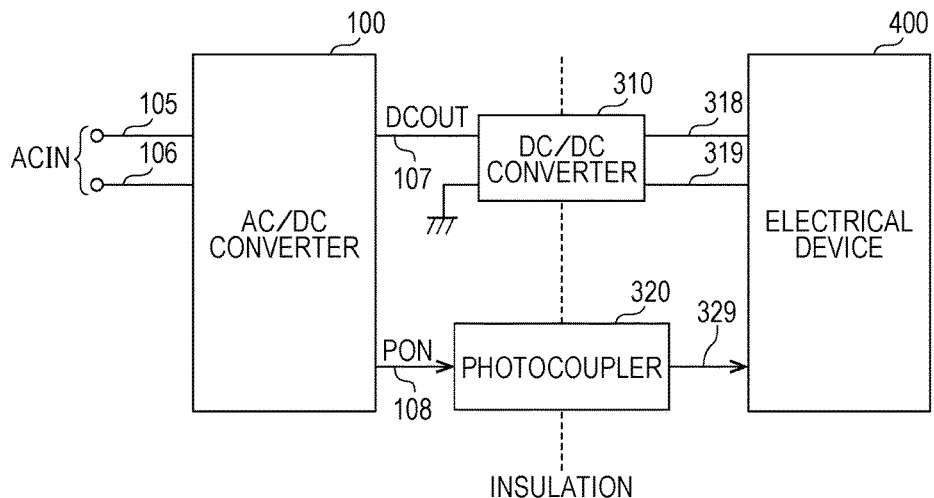
[Fig. 2]
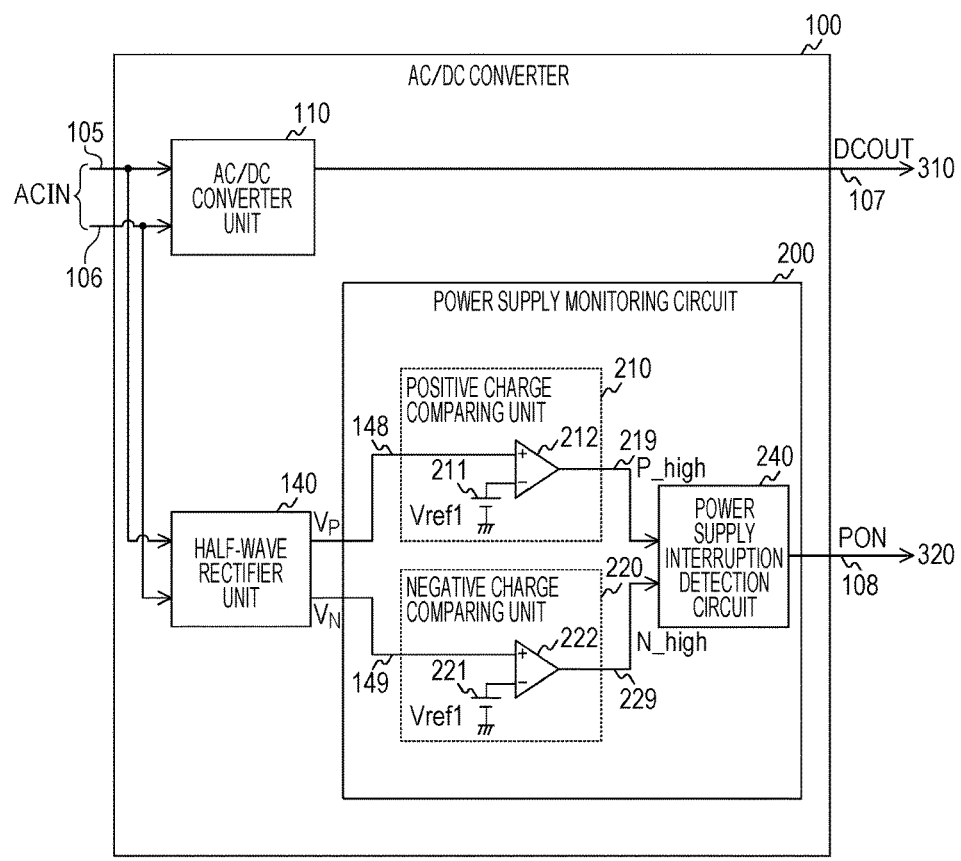

[Fig. 3]
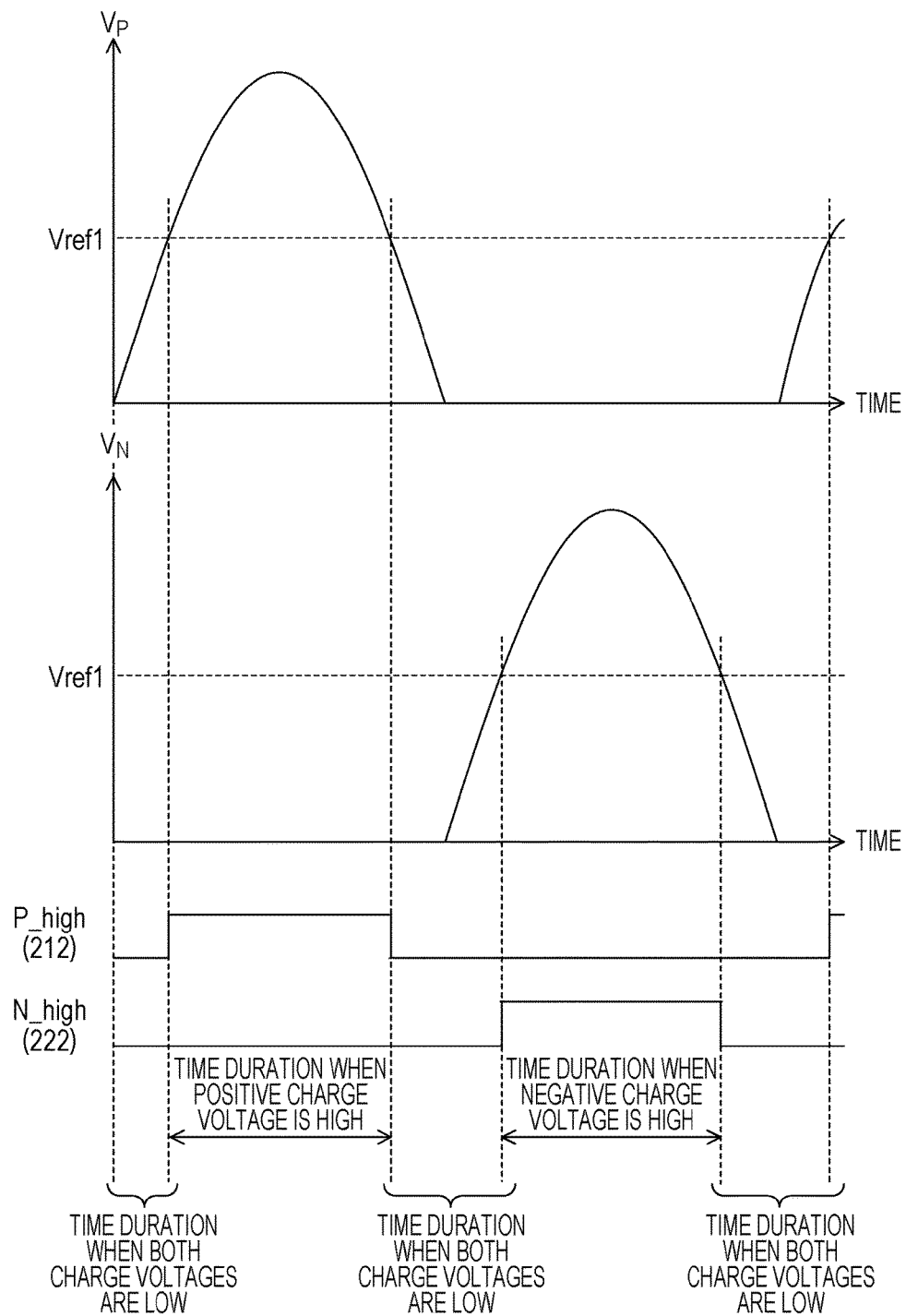

[Fig. 4]
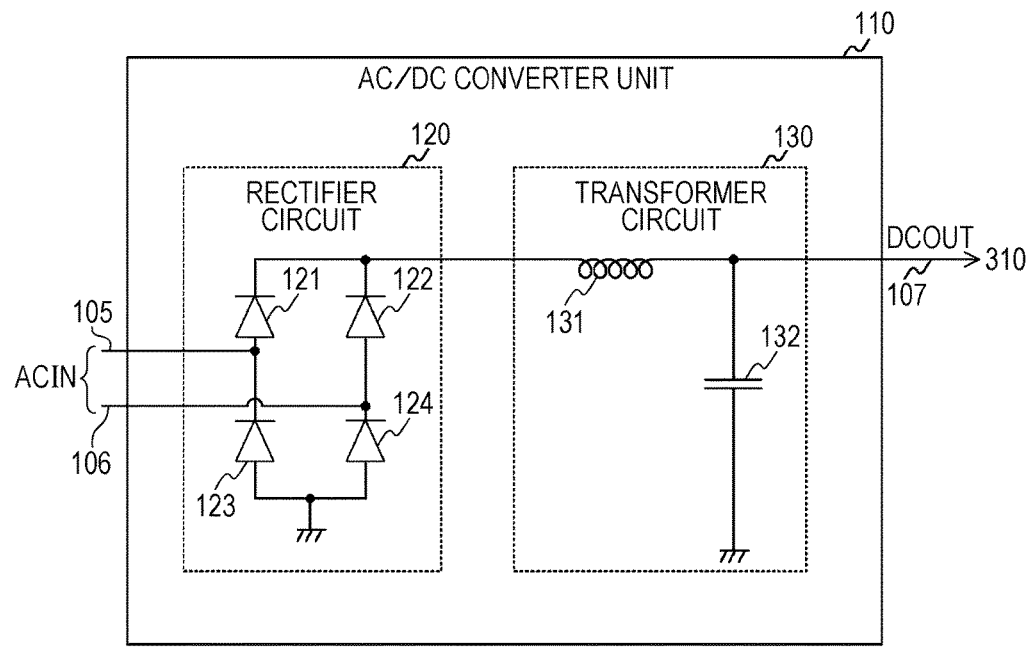

[Fig. 5]
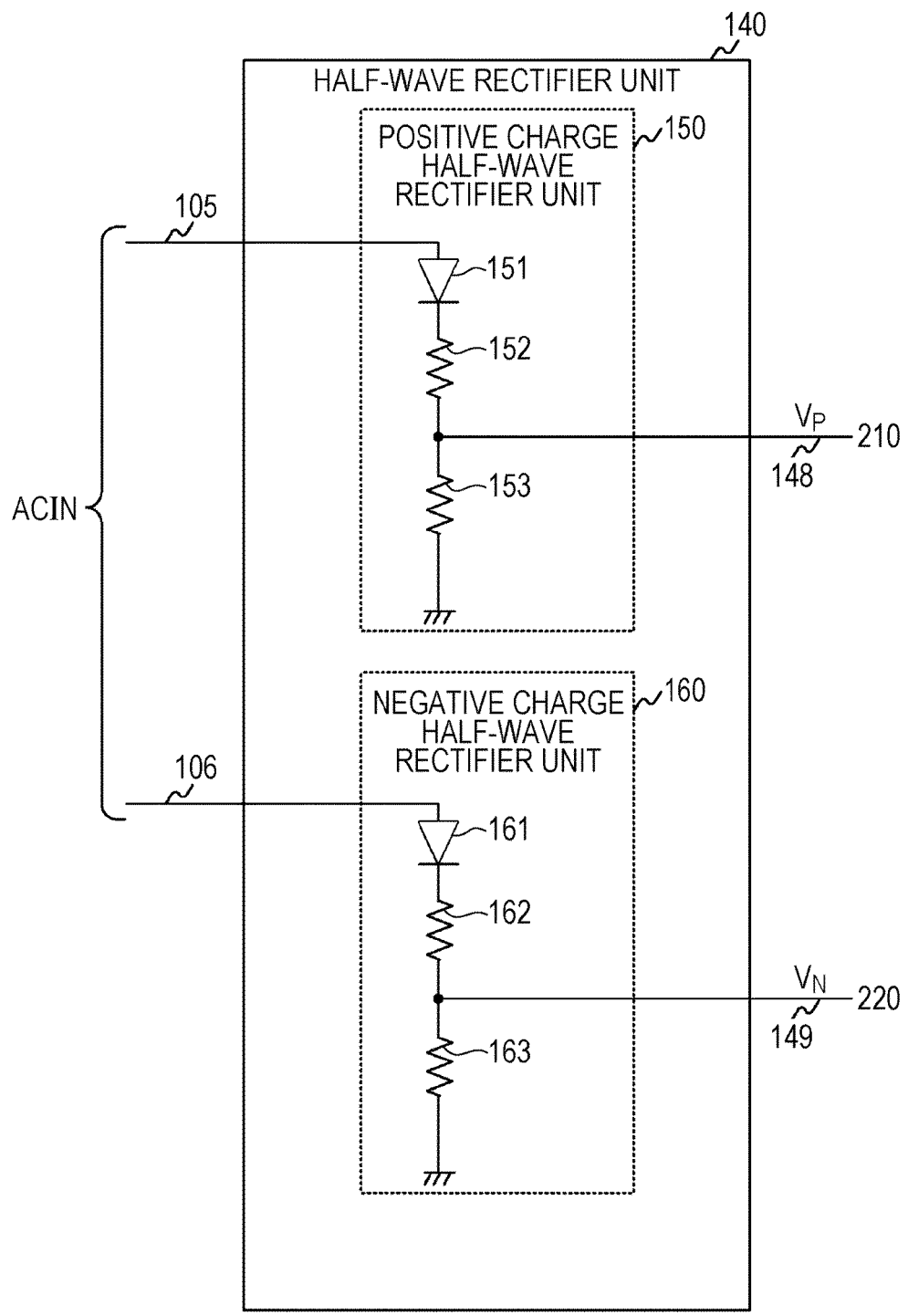

[Fig. 6]
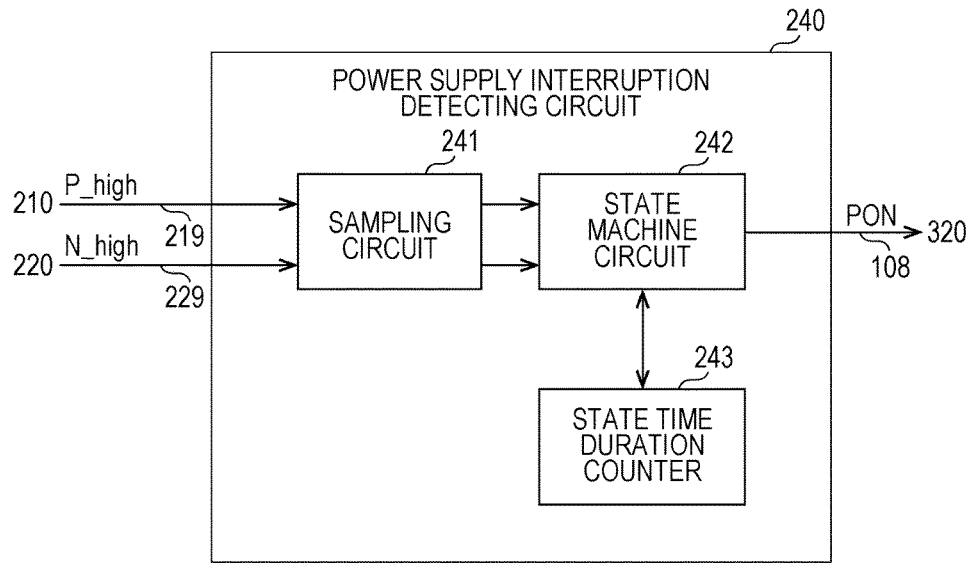
[Fig. 7]
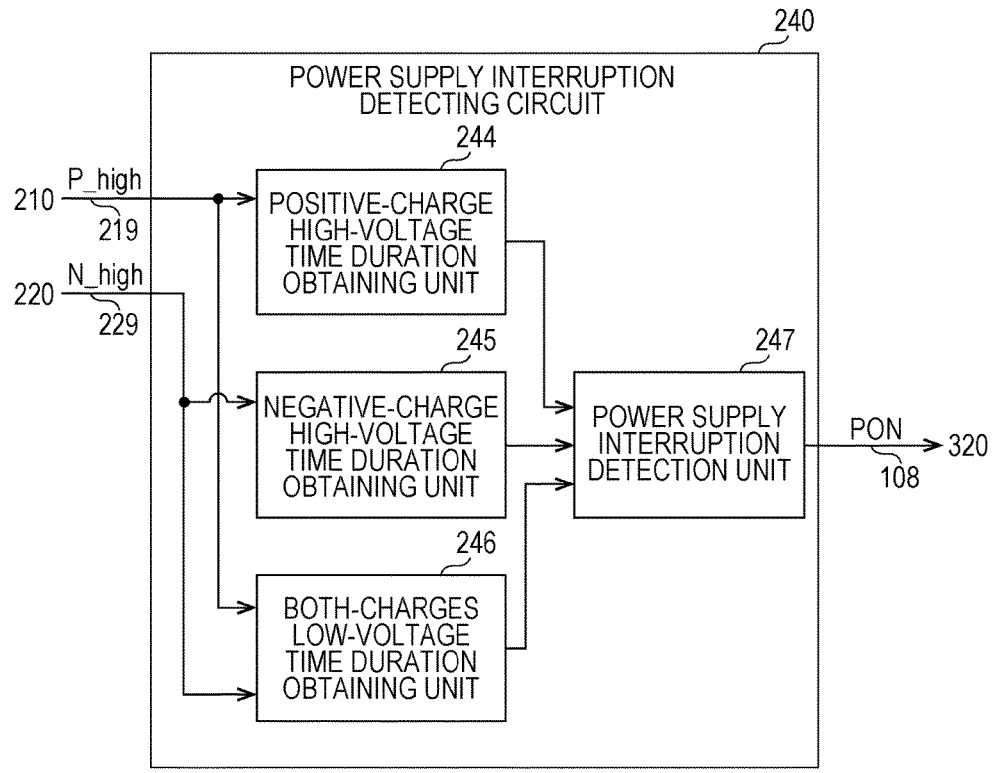

[Fig. 8]
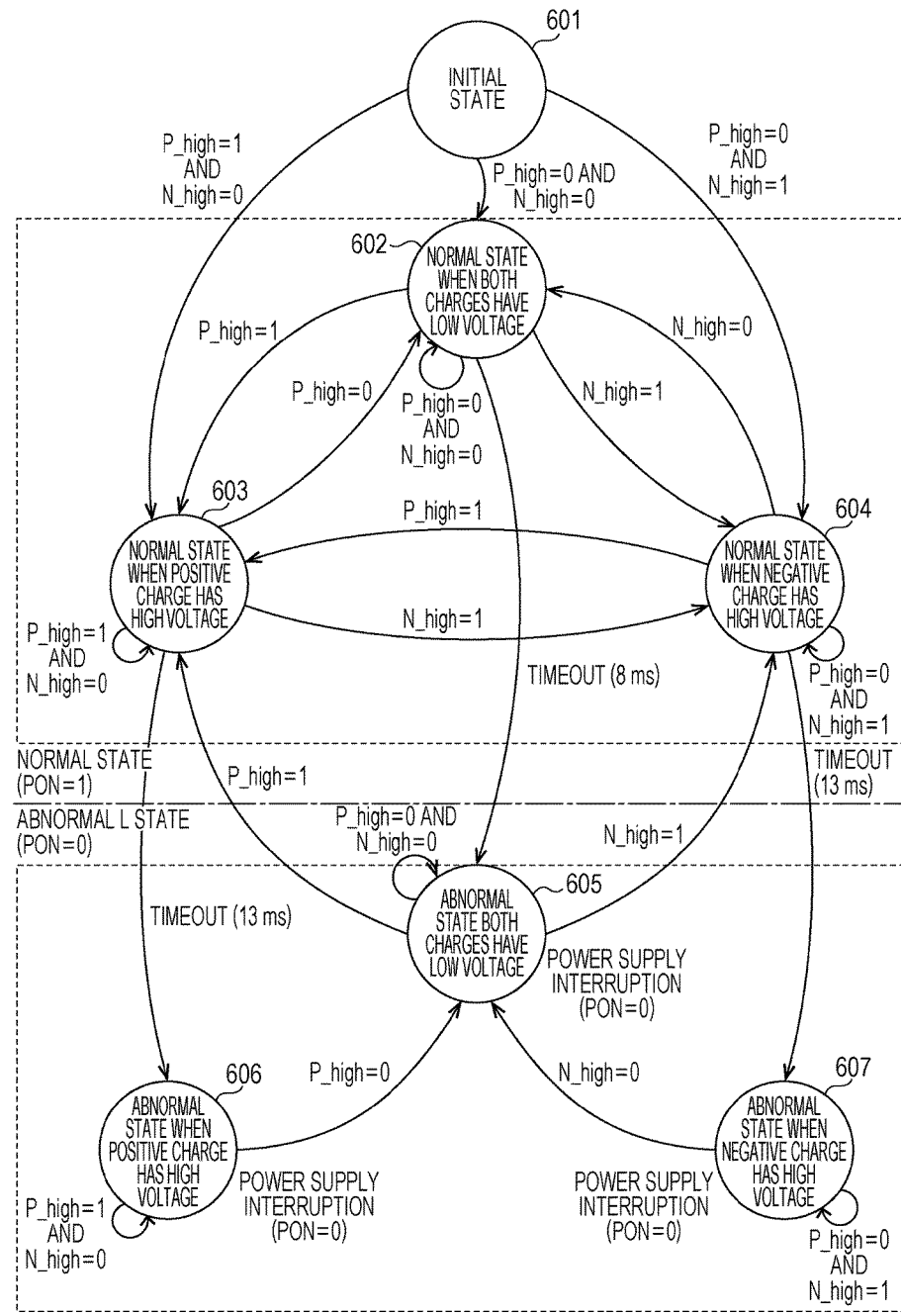

[Fig. 9]
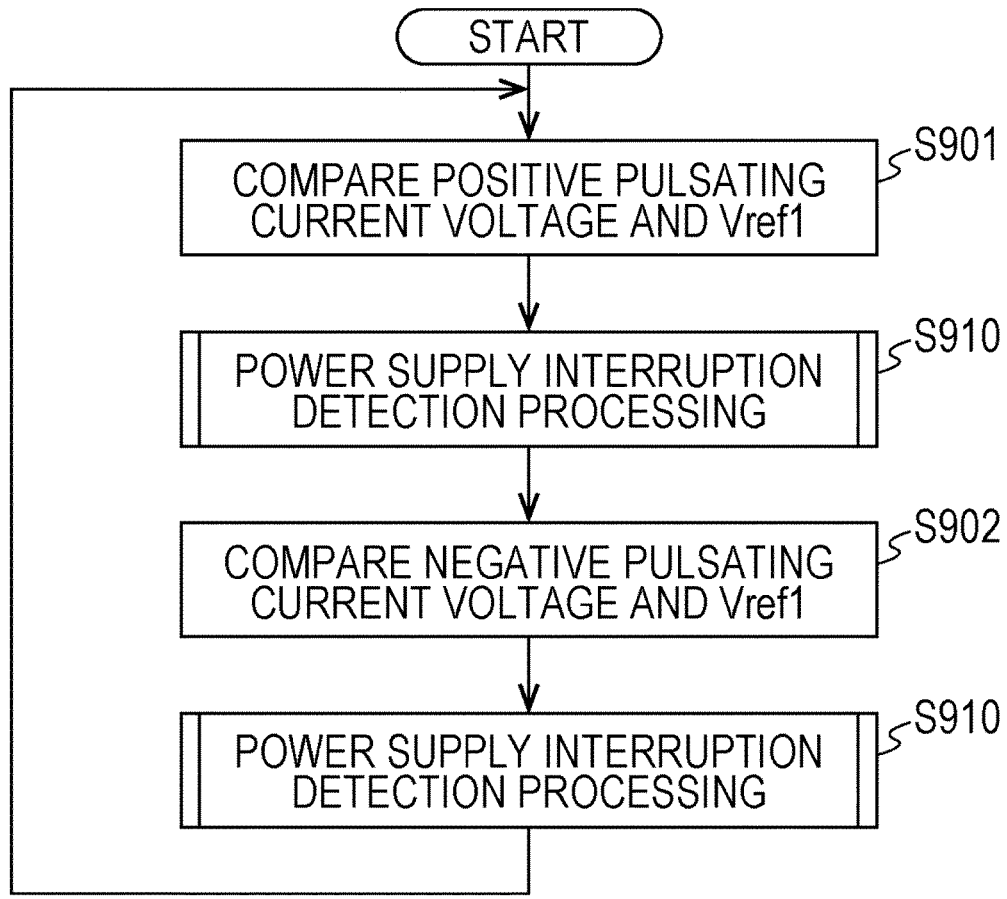

[Fig. 10]
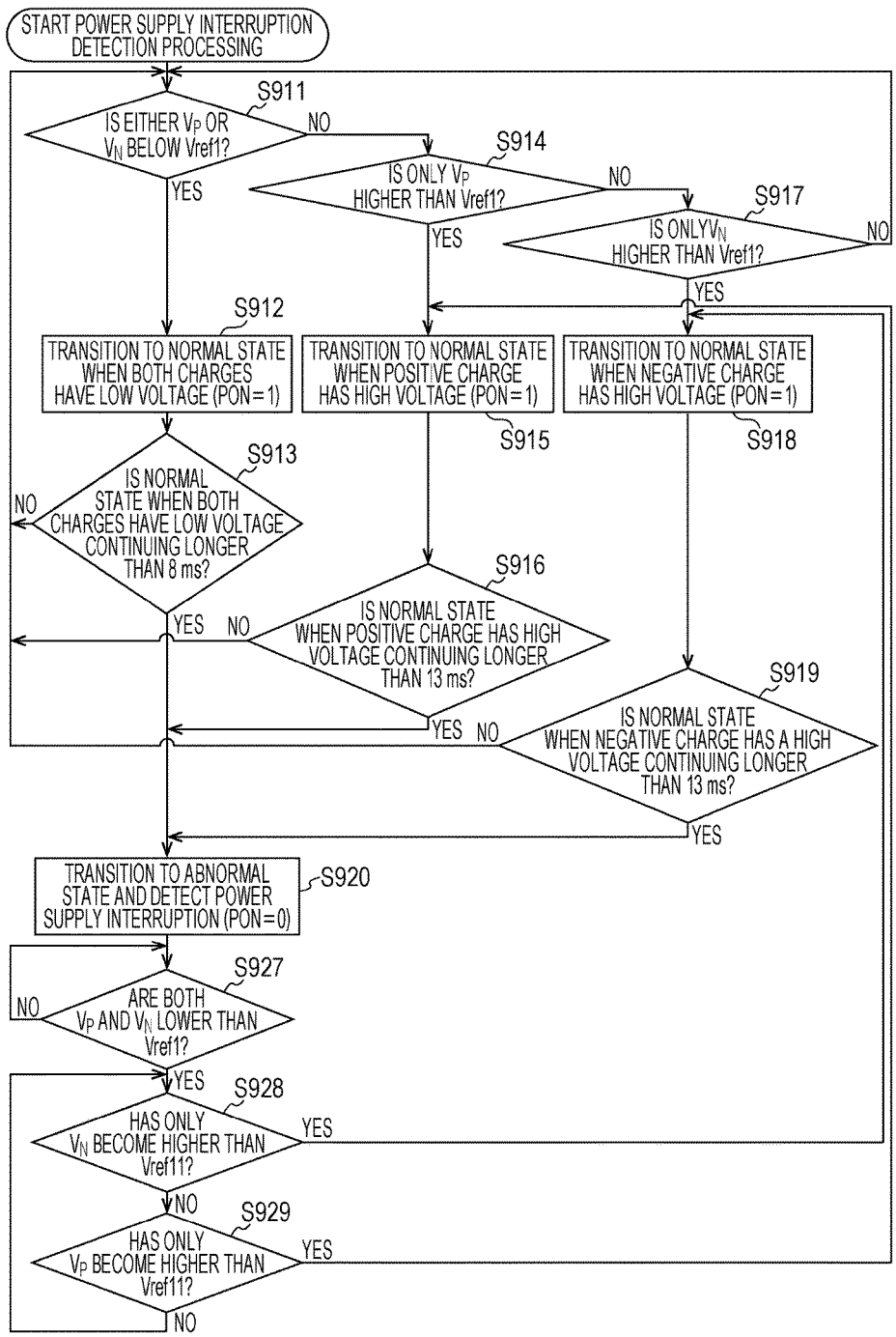

[Fig. 11]
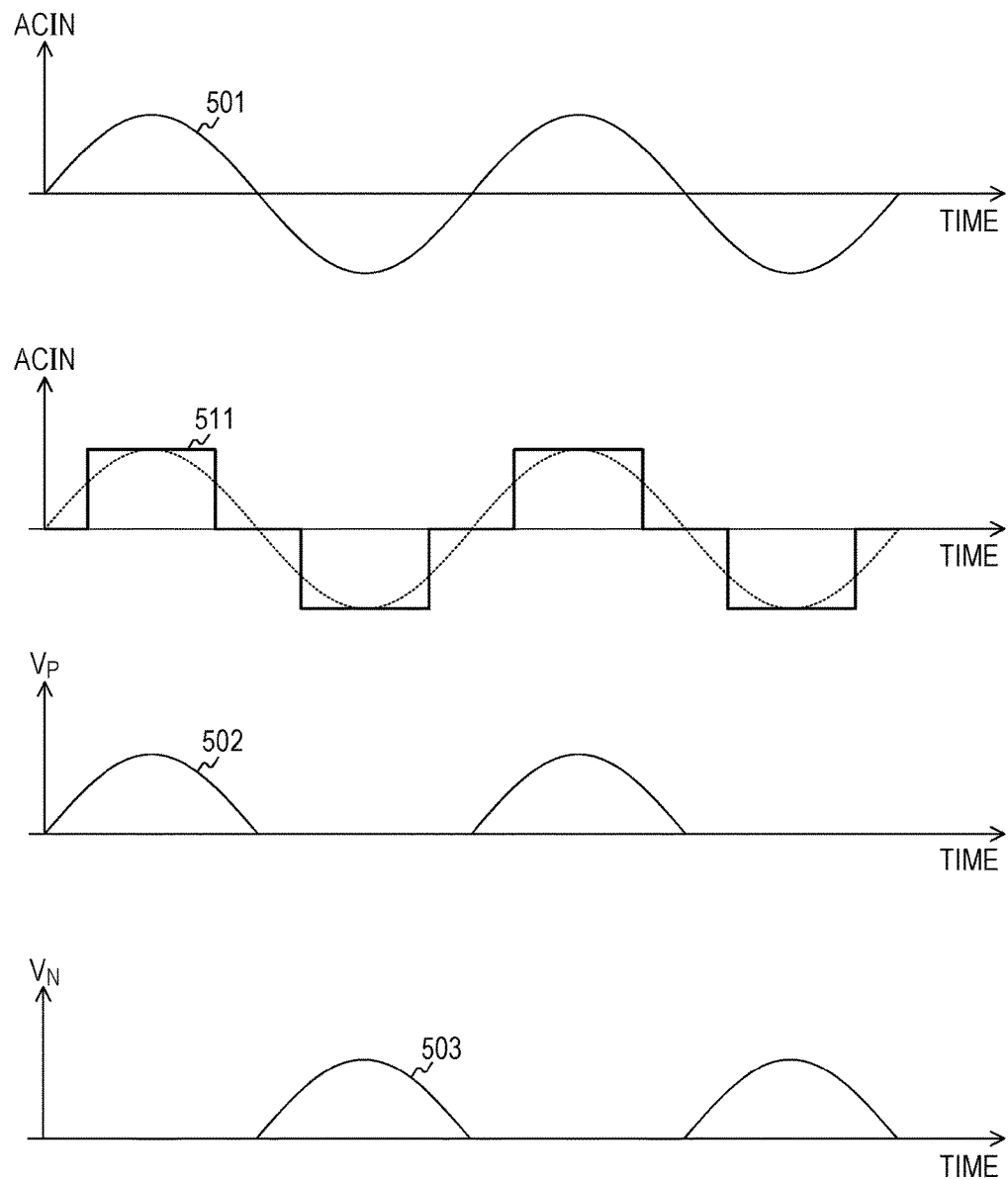

[Fig. 12]
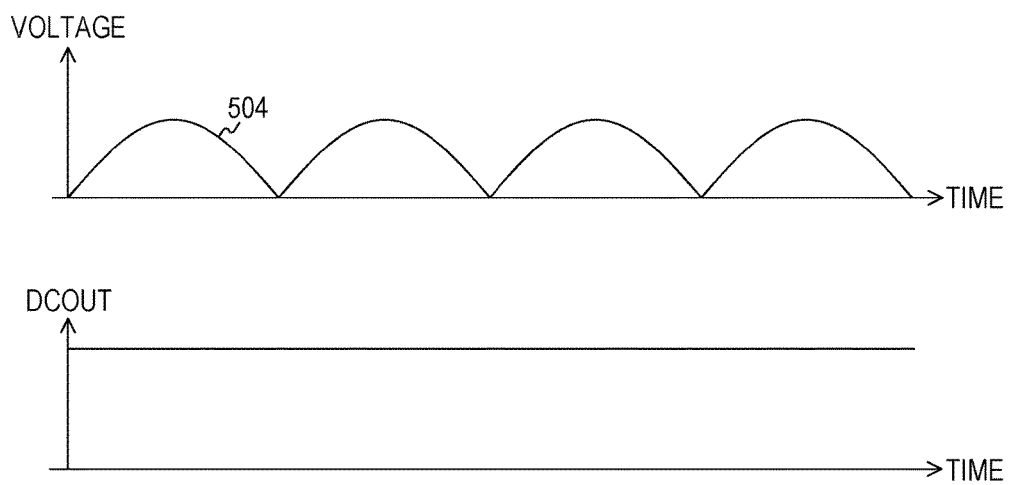

[Fig. 13]
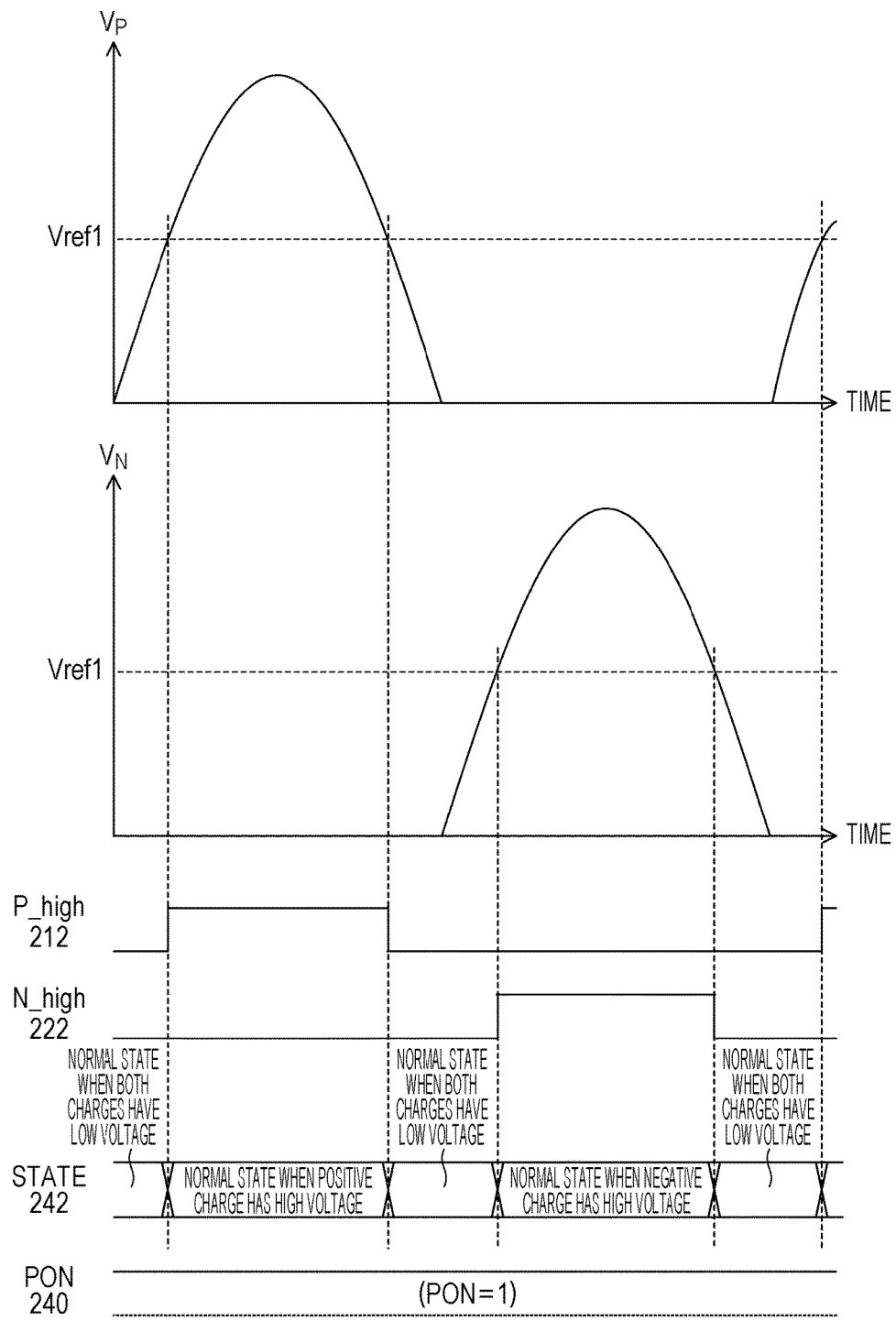

[Fig. 14]
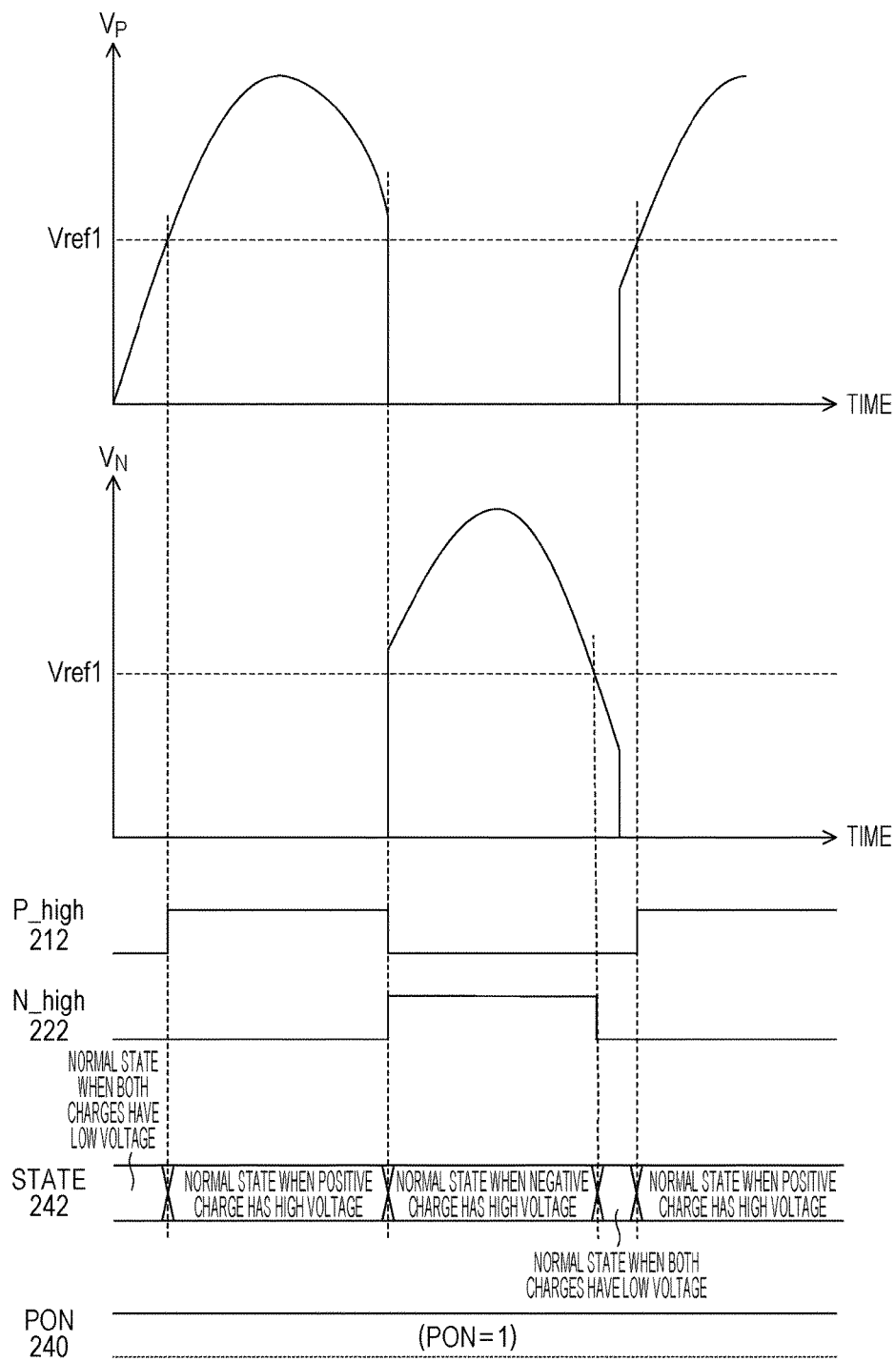

[Fig. 15]
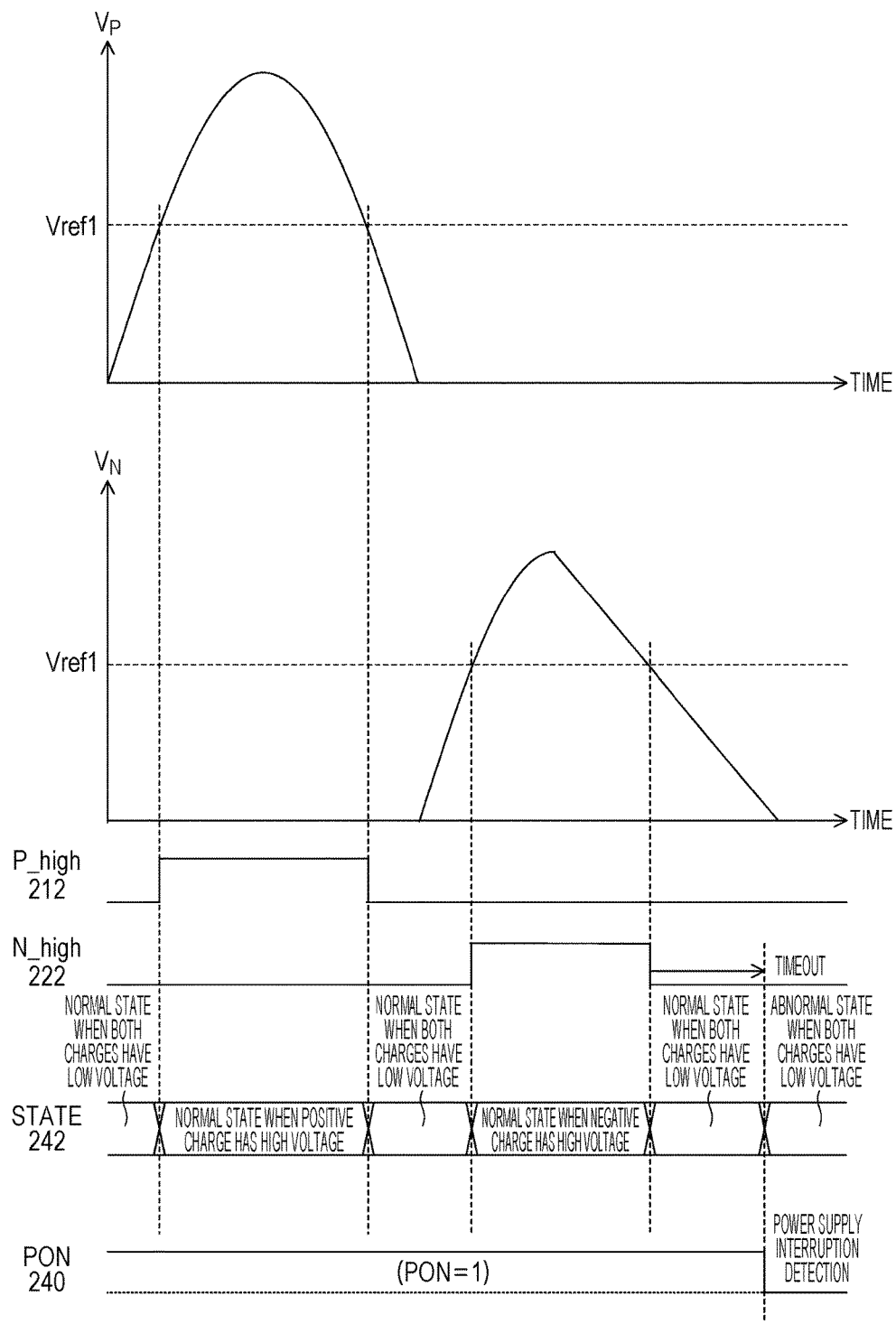

[Fig. 16]
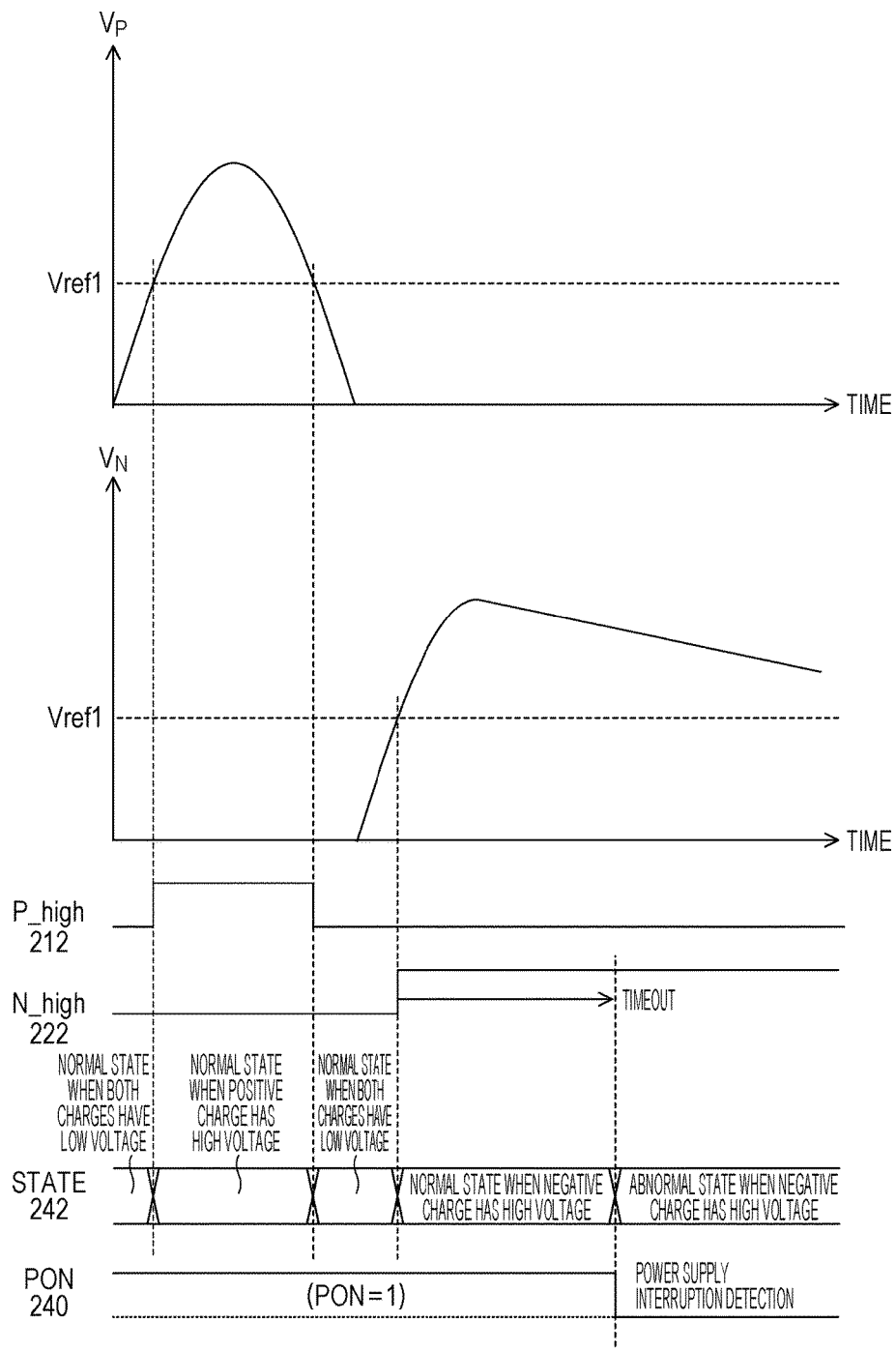

[Fig. 17]
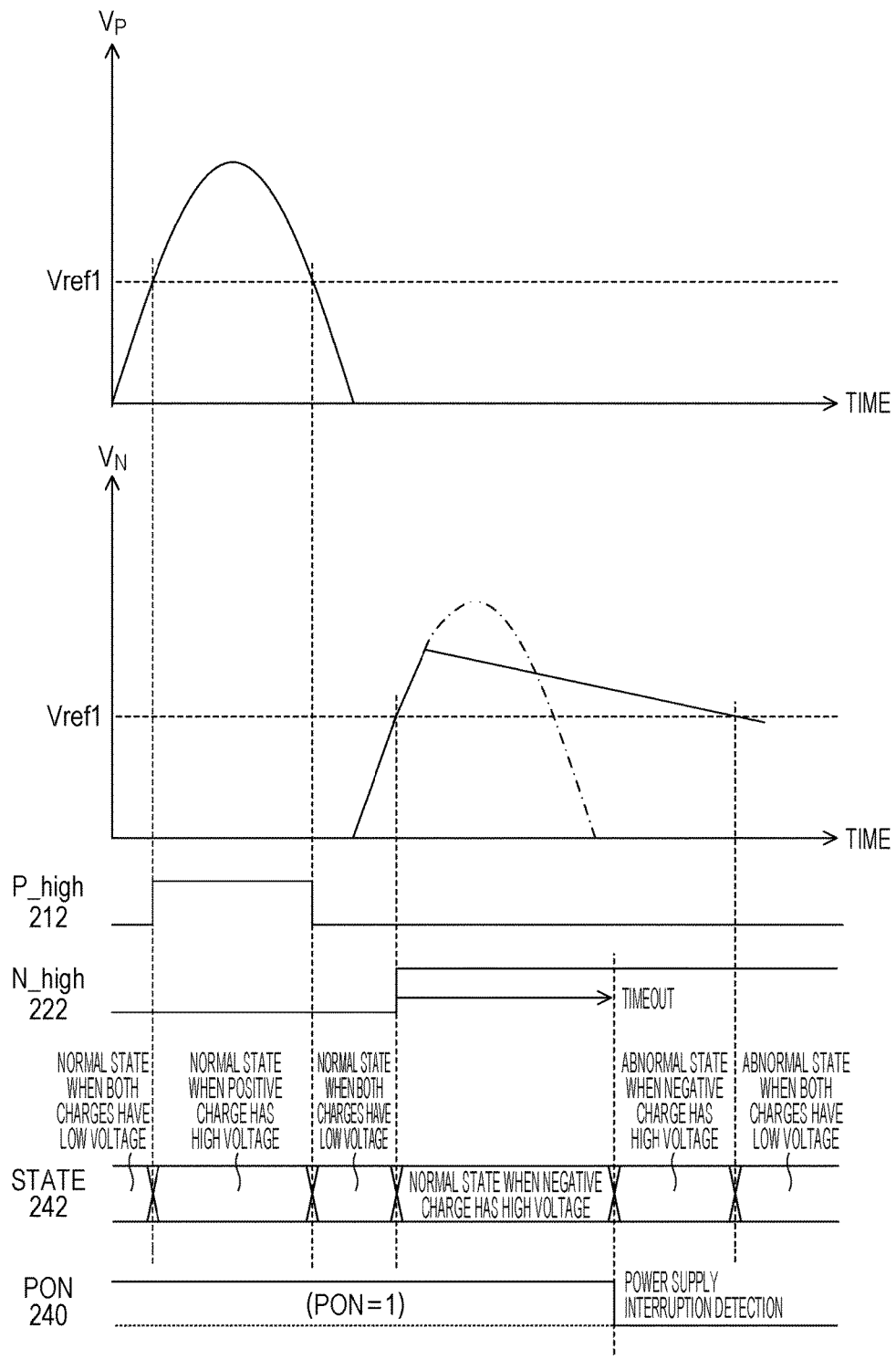

[Fig. 18]
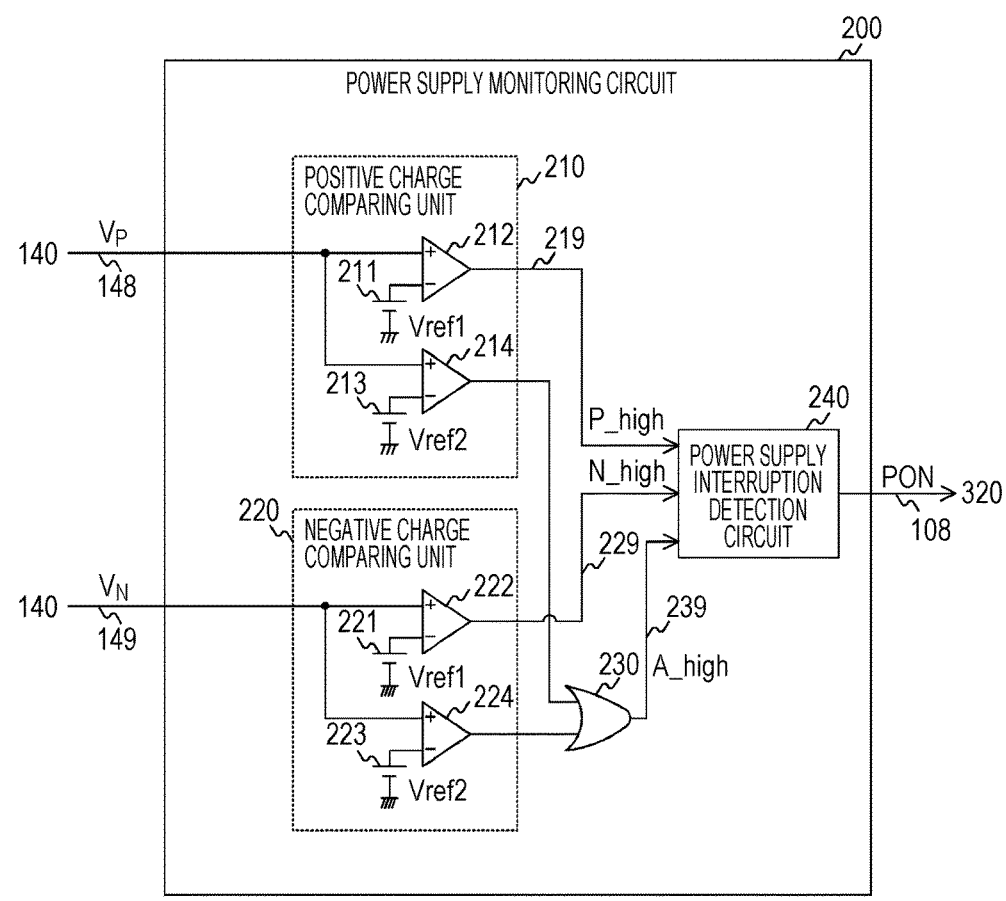

[Fig. 19]
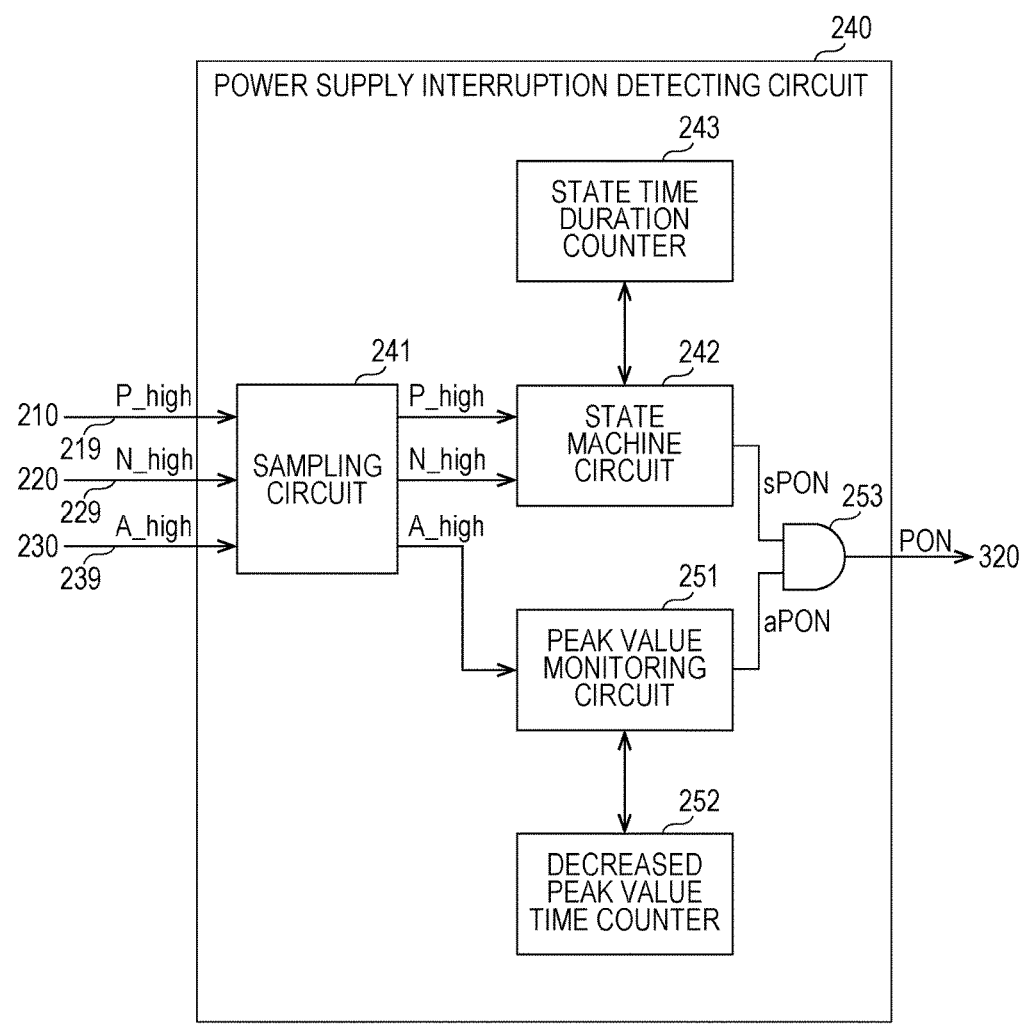

[Fig. 20]
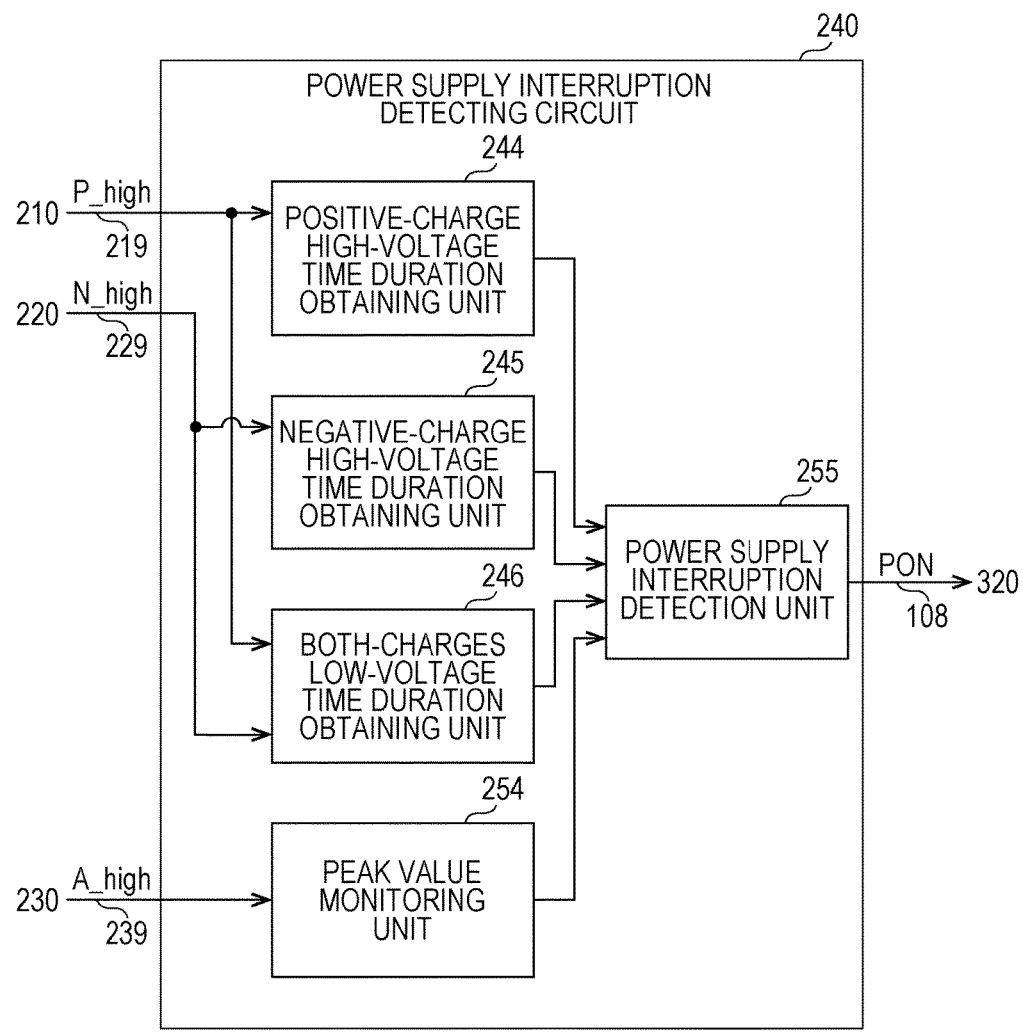

[Fig. 21]
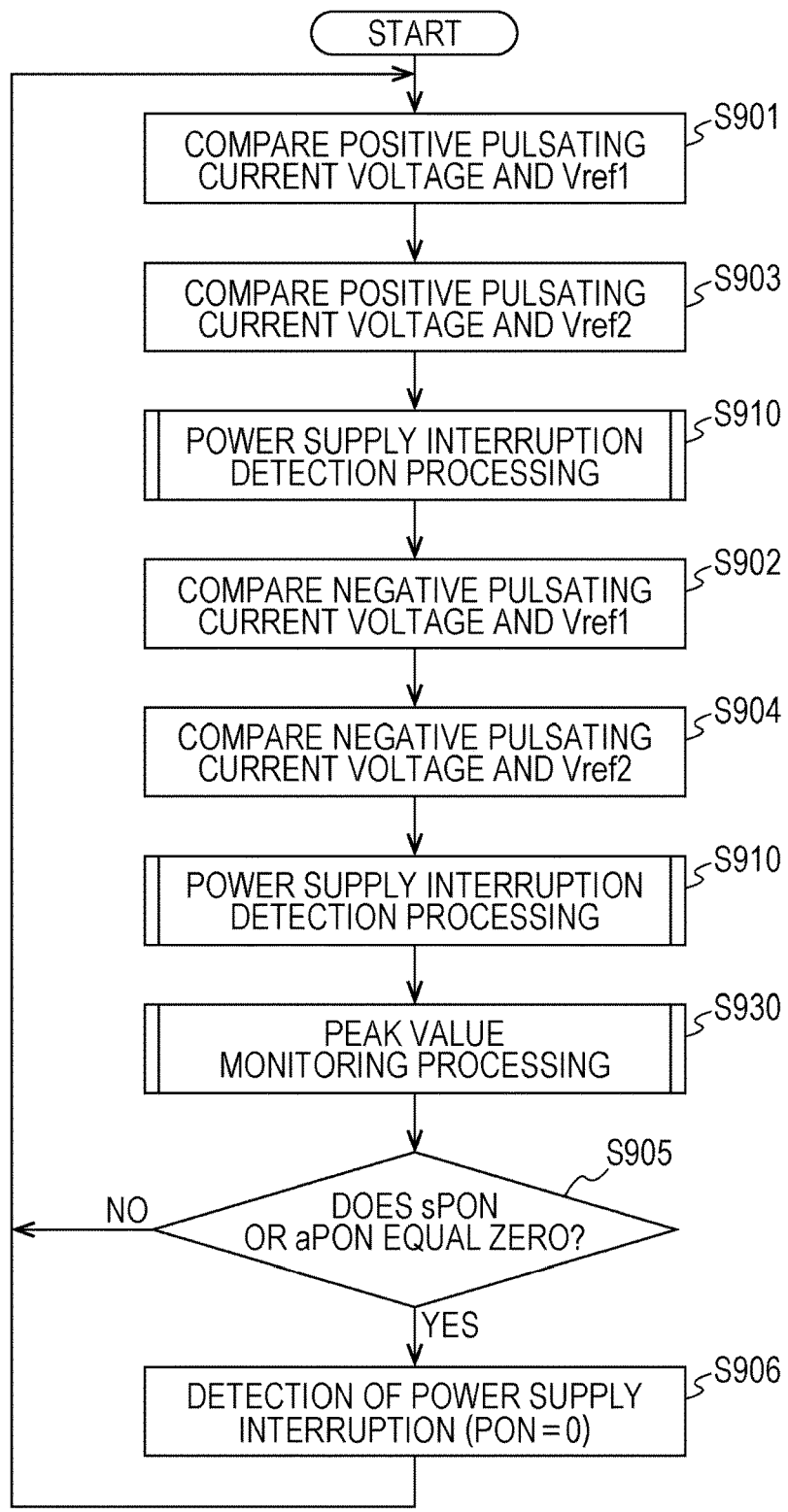

[Fig. 22]
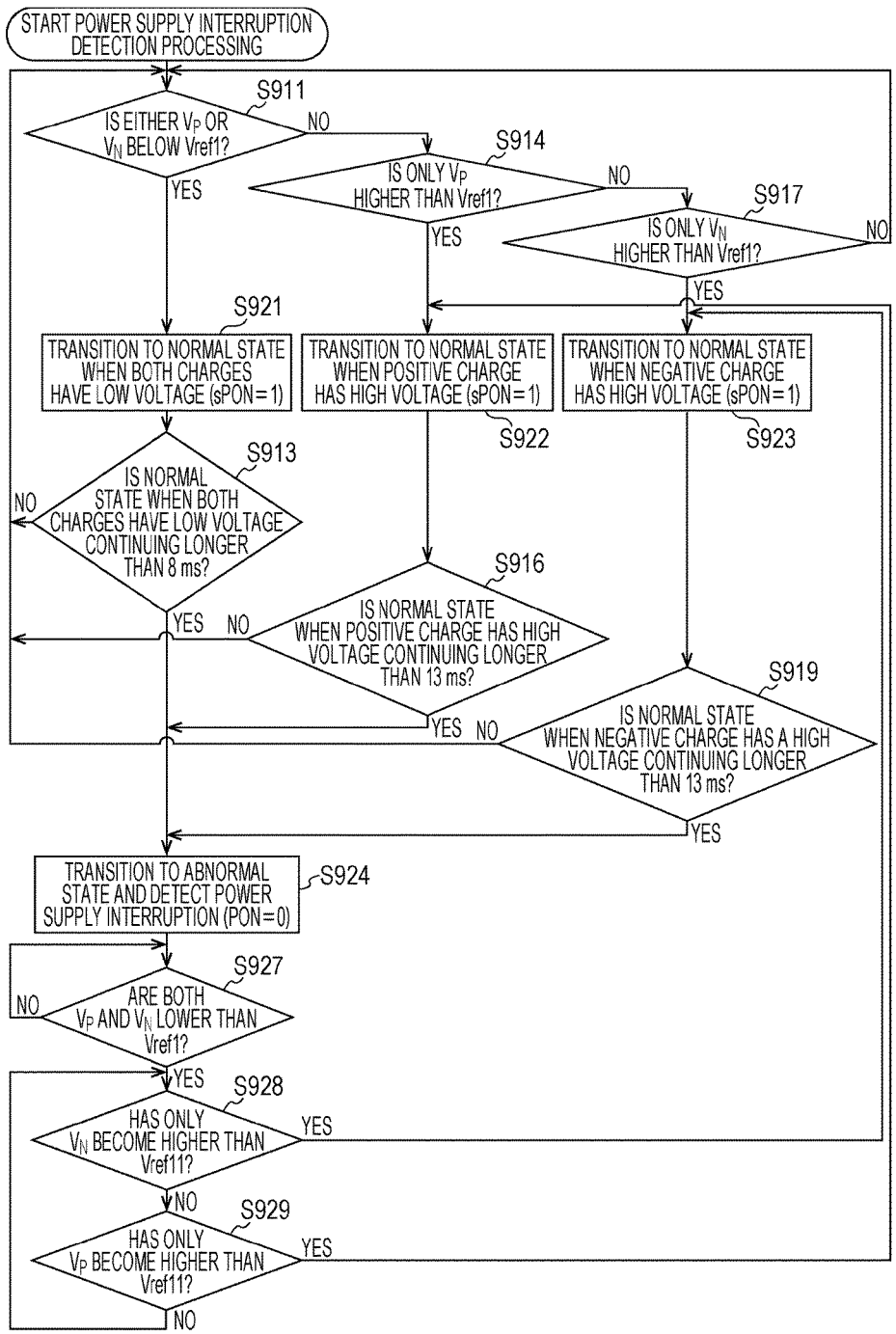

[Fig. 23]
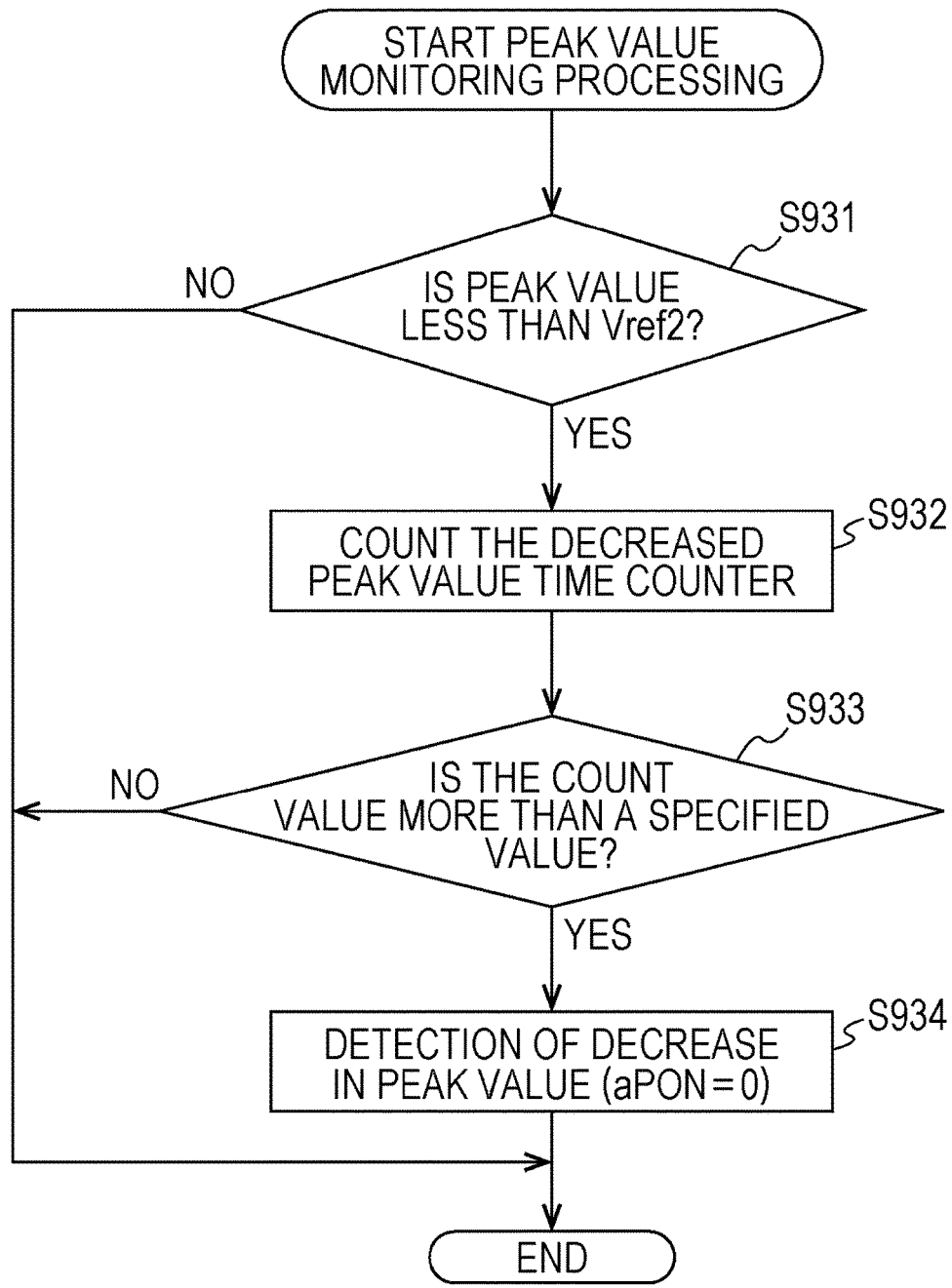

[Fig. 24]
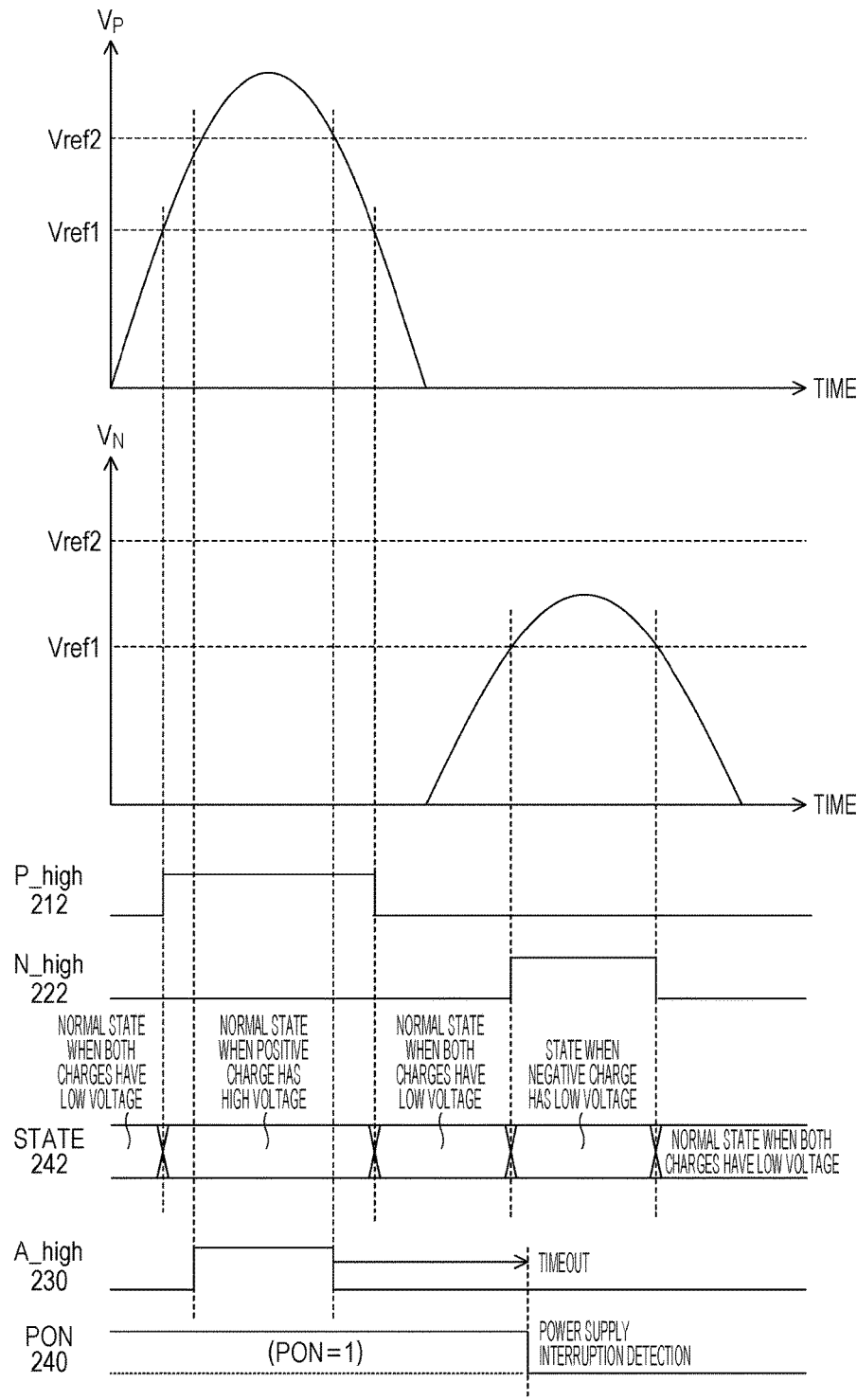

[Fig. 25]
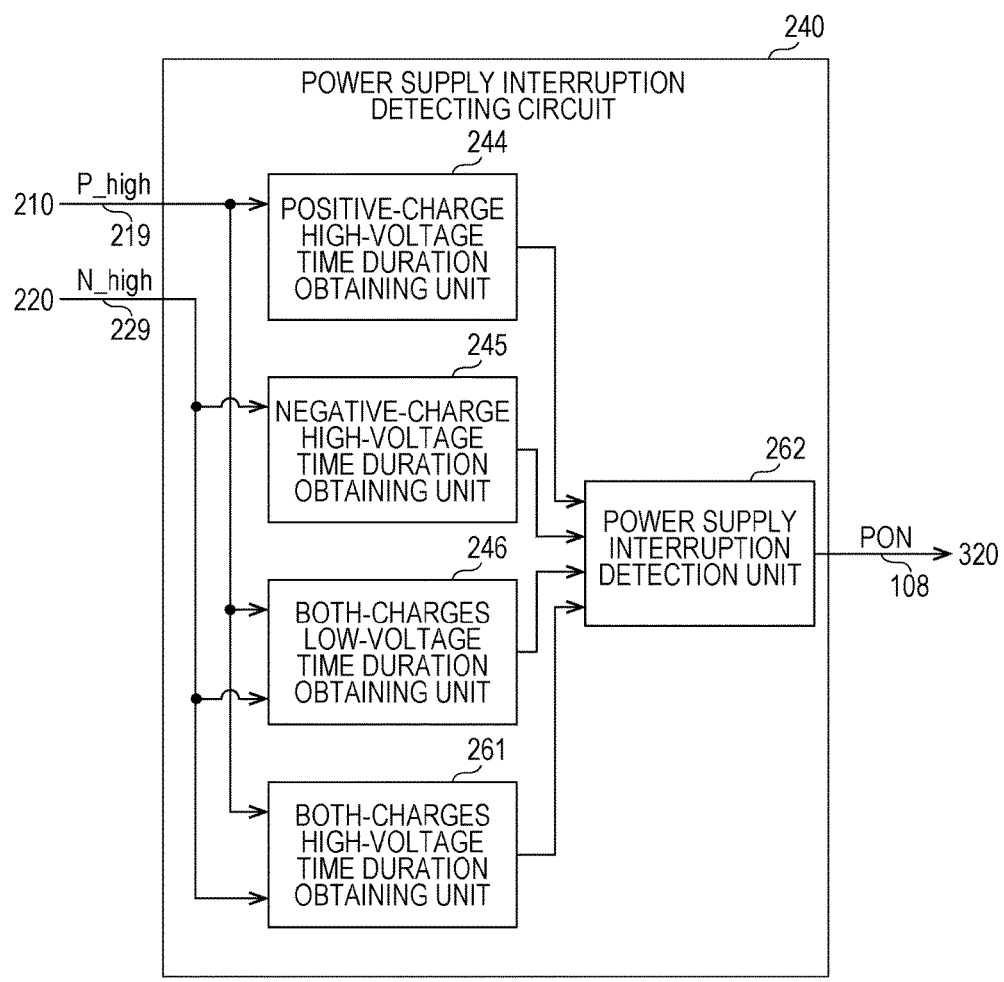

[Fig. 26]
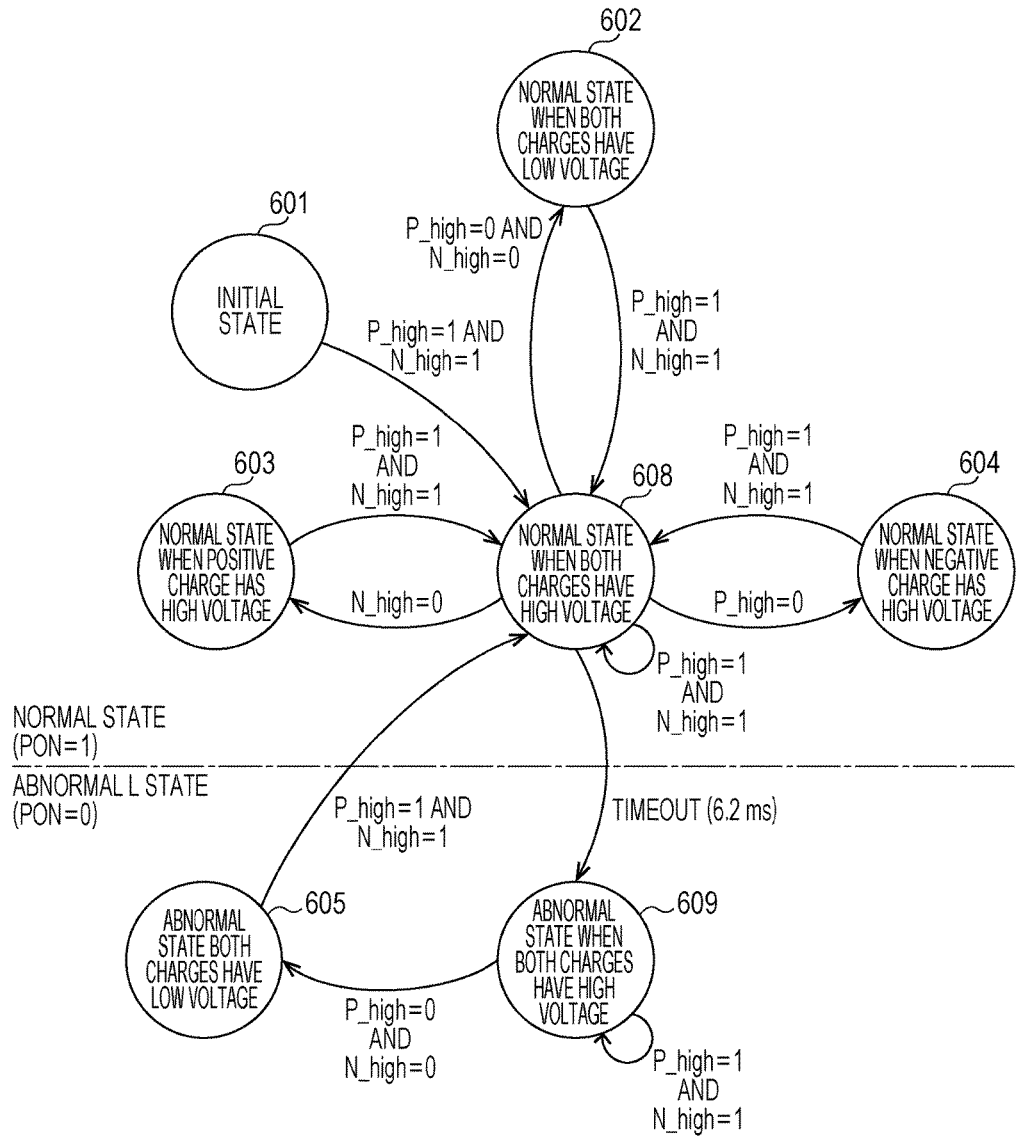

[Fig. 27]
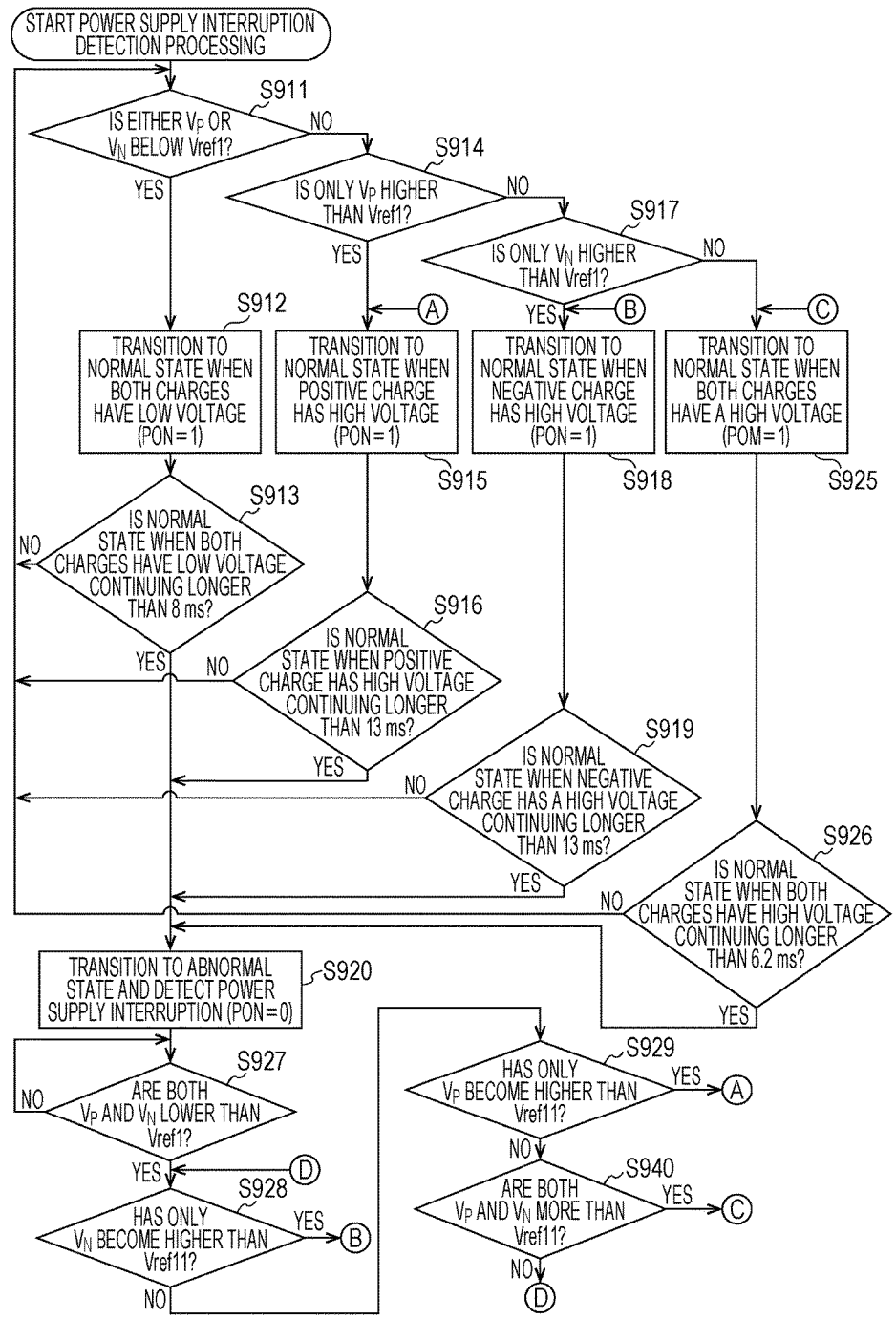

[Fig. 28]
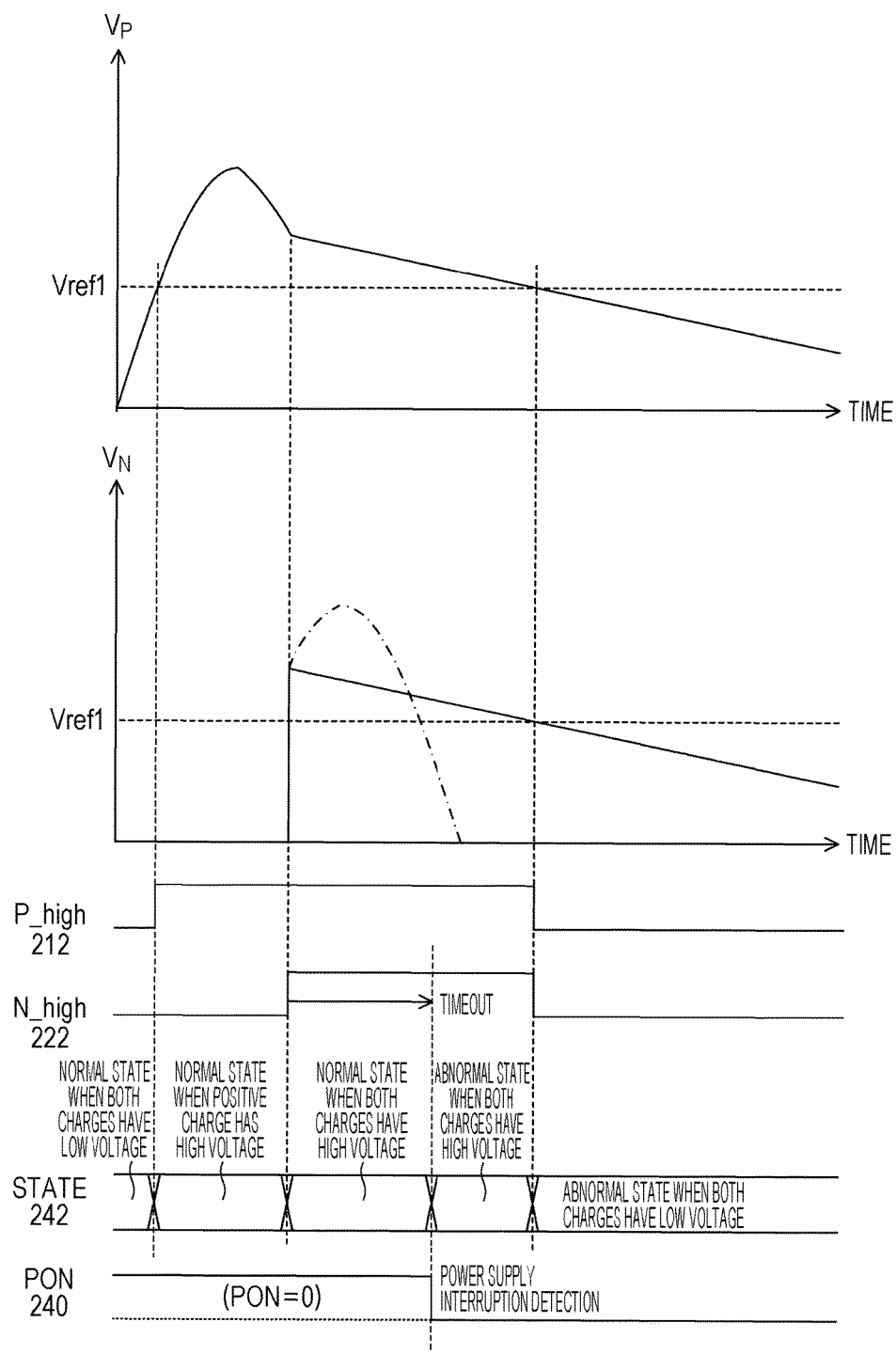

POWER SUPPLY MONITORING DEVICE, ELECTRONIC APPARATUS, AND POWER SUPPLY MONITORING METHOD

TECHNICAL FIELD

The disclosed relates to a power supply monitoring device, an AC/DC converting device, and a method to control the power supply monitoring device. Particularly, this relates to a power supply monitoring device, an AC/DC converting device, and a method to control the power supply monitoring device by detecting an interruption of a supply of alternating current power.

BACKGROUND ART

Alternating current/direct current (AC/DC) converters may be used in AC/DC power supplies to operate electrical devices that operate on direct current, and AC/DC converter may use large capacity block condensers or the like to convert alternating current into direct current. When the supply of power from the AC/DC power supply is interrupted due to power failures, etc., power may still supplied to receiving electrical devices from the AC/DC power supply for a certain amount of time due to the energy accumulated in the block condensers or similar. To enable a device shutdown processing or an operational shutdown of the electrical devices receiving the power, the AC/DC converter may output a detection signal to the respective electrical devices when an interruption in the supply of power from the AC/DC power supply is detected. In response to this detection signal, the electrical devices may execute the shutdown processing during a period until the power supplied from the AC/DC converter completely stops. The faster the AC/DC converter detects the interruption of the power supply, the sooner the shutdown processing may begin, which reduces time that the AC/DC converter has to continue to supply power. As the time that the power has to be supplied decreases, the capacity of the of the block condensers or similar may be reduced, and so it is desirable to quickly detect interruptions in the supply of alternating current power.

A power supply device has been proposed to detect the supply interruption of the alternating current power supply by generating a pulsating current is generated with full-wave rectification of the alternating current, for example, and then comparing the voltage of the pulsating current with a reference voltage derived from dividing the peak voltage of this pulsating current (refer to Japanese Unexamined Patent Application Publication No. 2010-261862). This power supply device detects an interruption in the supply of alternating current when a state in which the pulsating current voltage is higher than the reference voltage for a time longer than a timeout time, or when a state in which the pulsating current voltage at or below the reference voltage for a time longer than a timeout time.

CITATION LIST

Patent Literature

PTL 1: Japanese Unexamined Patent Application Publication No. 2010-261862

SUMMARY

Technical Problem

However, there is a possibility that the detection of the interruption in the supply of alternating current may be delayed. When there is a floating capacitance in the wiring path to which the pulsating current voltage is applied, or when an offset voltage is generated in the rectifier current circuit for performing rectification of the alternating current, a cycle may occur in which the peak of the pulsating current voltage does not decrease significantly. When such a cycle occurs, the state in which the pulsating current voltage is higher than the reference voltage may continue for a long time. When the state in which the pulsating current voltage is higher than the reference voltage continues for a long time during the supply of power, a determination may be made that the supply of alternating current has been interrupted regardless of whether the alternating power is being supplied if the timeout time for this state is sufficiently long. For example, if the timeout time is not long enough, there may be a false detection of power supply interruptions. However, if the timeout time is made long enough to avoid false detections, actual detections of supply interruptions may be delayed when the supply of alternating current power is actually stopped. Particularly, when the load of the alternating current is light regarding power supply boards without power factor correction (PFC), the rate of consumption of the energy accumulated in the condensers slows down, and the speed with which the pulsating current voltage decreases also slows down. For this reason, delays in the detection of interruptions in the supply of alternating current power are significant.

Solution to Problem

In view of the above circumstances, disclosed herein is a power supply monitoring device, an AC/DC converting device, and a method to control the power supply monitoring device that detects whether or not there has been an interruption in the supply of alternating current power by determining whether or not the power supply interruption determination time is longer than the time duration. That is, for example, a power supply monitoring device, comprising a monitoring circuit that includes a first charge comparing unit configured to generate a first comparison result based on a first pulsating signal, a second charge comparing unit configured to generate second comparison result based on a second pulsating signal, and a power interruption detection unit configured to output a detection signal based on whether the first and second comparison results indicate a supply of power has been interrupted.

Advantageous Effects of Invention

Thus, the disclosed has a superior technical advantage in that quick and accurate detection of interruptions in the supply of alternating current power is enabled even for power supply boards not equipped with a PFC.

BRIEF DESCRIPTION OF DRAWINGS

FIG. 1 is a general overview illustrating an example configuration of an electrical device system.

FIG. 2 is a block diagram illustrating an example configuration of an AC/DC converter.

FIG. 3 is an example timing chart describing various states of a time duration.

FIG. 4 is a circuit diagram illustrating an example configuration of an AC/DC converter unit.

FIG. 5 is a circuit diagram illustrating an example of a half-wave rectifier unit.

FIG. 6 is a block diagram illustrating an example configuration of a power supply interruption detection circuit.

FIG. 7 is a block diagram illustrating an example of a power supply interruption detection circuit.

FIG. 8 is a diagram of transitional states illustrating example operations of a state machine circuit.

FIG. 9 is a flowchart illustrating an example of operations of a power supply monitoring circuit.

FIG. 10 is a flowchart illustrating an example of a power supply interruption detection processing.

FIG. 11 is a diagram illustrating an example of a waveform of alternating current voltage.

FIG. 12 is a diagram illustrating an example of a waveform and a value of a pulsating current voltage.

FIG. 13 is a timing chart illustrating an example of operations of the power supply monitoring circuit during the supply of power.

FIG. 14 is a timing chart illustrating an example of operations of the power supply monitoring circuit when the shape of the power waveform is unstable.

FIG. 15 is a timing chart illustrating an example of operations of the power supply monitoring circuit at a time when the supply of power is interrupted due to a heavy load being connected to the alternating current power supply.

FIG. 16 is a timing chart illustrating an example of operations of the power supply monitoring circuit when the supply of power is interrupted due to a light load being connected to the alternating current power supply.

FIG. 17 is a timing chart illustrating an example of operations of the power supply monitoring circuit when the supply of alternating current power is interrupted at a timing when the voltage extends beyond the peak voltage.

FIG. 18 is a block diagram illustrating an example configuration of a power supply interruption monitoring circuit.

FIG. 19 is a block diagram illustrating an example configuration of a power supply interruption detecting circuit.

FIG. 20 is a block diagram illustrating an example of the power supply interruption detecting circuit.

FIG. 21 is a flowchart illustrating an example of operations of a power supply monitoring circuit.

FIG. 22 is a flowchart illustrating an example of a power supply interruption detection processing.

FIG. 23 is a flowchart illustrating an example of a peak value monitoring processing.

FIG. 24 is a timing chart illustrating an example of operations of the power supply monitoring circuit when the peak value decreases.

FIG. 25 is a block diagram illustrating an example of a power supply interruption detecting circuit.

FIG. 26 is a chart of transitional states illustrating an example of operations of a state machine.

FIG. 27 is a flowchart illustrating an example of a power supply interruption detection processing.

FIG. 28 is a timing chart illustrating an example of an operation of a power supply monitoring circuit when the supply of power is interrupted.

DESCRIPTION OF EMBODIMENTS

It view of the above, it is desirable to provide a power supply board that is not equipped with a PFC, but is able to quickly and accurately detect interruptions in the supply of alternating current power. Therefore, for example, an embodiment of the disclosed is a power supply monitoring device and a control method thereof, in which the power supply monitoring device is equipped with a time duration obtaining unit configured to obtain a time duration, which is the duration of time in which a value of alternating current with half-wave rectification is higher than a predetermined reference value, and with a power interruption detecting unit configured to detect whether or not the supply of alternating current power has been interrupted by determining whether or not a power supply interruption determination time, which is shorter than a cycle of the previously described alternating current, is longer than the time duration. As a result, whether or not there has been an interruption in the supply of alternating current power is detected by determining whether or not the power supply interruption determination time is longer than the time duration.

Also, a positive-charge high-voltage time duration obtaining unit configured to obtain a time duration when the positive charge has a high voltage, which is the time of a state at which a value of the positive voltage of the alternating current or a value of the positive alternating current which has been processed by half-wave rectification continues to be higher than the reference value may be included in the power supply monitoring device. Further, a negative-charge high-voltage time duration obtaining unit configured to obtain a time duration when the negative charge has a high voltage may be included in the power supply monitoring device. The time duration when the negative charge has a high voltage is the time of a state at which a value of the negative voltage of the alternating current or a value of the negative alternating current which has been processed by half-wave rectification continues to be higher than the reference value. Therefore, the power supply interruption detection unit may detect whether or not the supply of alternating current power has been interrupted by whether or not the time duration when positive charge has high voltage is longer than the power supply interruption determination time during a period in which the time duration when positive charge has high voltage is being obtained, and may detect whether or not the supply of alternating current power has been interrupted by whether or not the time duration when negative charge has high voltage is longer than the power supply interruption determination time during a period in which the time duration when negative charge has high voltage is being obtained. This yields an advantage in that whether or not the supply of alternating current power has been interrupted is detected by whether or not the time duration when positive charge has high voltage is longer than the power supply interruption determination time during a period in which the time duration when positive charge has high voltage is being obtained. Further, whether or not the supply of alternating current power has been interrupted is detected by whether or not the time duration when negative charge has high voltage is also longer than the power supply interruption determination time during a period in which the time duration when negative charge has high voltage is being obtained.

Also may be provided is a both-charges low-voltage time duration obtaining unit configured to obtain a time duration when both charges have a low voltage, which is the time of a state at which a value of the positive and negative voltage of the alternating current or a value of the positive and negative alternating current which has been processed by half-wave rectification continues to be higher than the reference value, with the power supply interruption detection unit detecting whether or not the supply of alternating current power has been interrupted by whether or not the time duration when both charges have low voltage is longer than the power supply interruption determination time during a period in which the time duration when both charges have low voltage is being obtained. This is advantageous in that whether or not the supply of alternating current power has been interrupted is detected by whether or not the time duration when both charges have low voltage is longer than the power supply interruption determination time.

Also may be provided is a both-charges high-voltage time duration obtaining unit configured to obtain a time duration when both charges have a high voltage, which is the time of a state at which a value of the positive and negative voltage of the alternating current or a value of the positive and negative alternating current which has been processed by half-wave rectification continues to be higher than the reference value, with the power supply interruption detection unit detecting whether or not the supply of alternating current power has been interrupted by whether or not the time duration when both charges have high voltage is longer than the power supply interruption determination time during a period in which the time duration when both charges have high voltage is being obtained. This is advantageous in that whether or not the supply of alternating current power has been interrupted is detected by whether or not the time duration when both charges have high voltage is longer than the power supply interruption determination time.

Also may be provided is a determination unit configured to determine whether or not a maximum value of the alternating current which has been processed by half-wave rectification is lower than a predetermined value, with the power supply interruption detection unit detecting that the supply of alternating current power has been interrupted when the maximum value is less than the predetermined value, or when the time duration is longer than the power supply interruption detection time. This is advantageous in that detection is made that the supply of alternating current power has been interrupted when the maximum value is less than the predetermined value, or when the time duration is longer than the power supply interruption detection time.

Also may be provided is a comparing unit configured to compare the value of alternating current which has been processed with half-wave rectification and the reference value, with the time duration obtaining unit obtaining the time duration on the basis of a comparison result between the value of alternating current which has been processed with half-wave rectification and the reference value. This is advantageous in that the time duration is obtained on the basis of a comparison result between the value of alternating current which has been processed with half-wave rectification and the reference value.

Also, according to another embodiment, an AC/DC converting device is provisioned with an AC/DC converter unit configured to convert alternating current into direct current, a half-wave rectification unit configured to perform half-wave rectification on the alternating current, a time duration obtaining unit configured to obtain a time duration, which is a time of a state at which a value of the alternating current which has been processed with half-wave rectification continues to be higher than a predetermined reference value, and a power supply interruption detection unit configured to detect whether or not the supply of alternating current power has been interrupted by whether or not the time duration is longer than a power supply interruption determination time, which is shorter than a cycle of the alternating current. This is advantageous in that whether or not the supply of alternating current has been interrupted is detected by whether or not the time duration is longer than a power supply interruption determination time.

Hereafter, the embodiments of the disclosed (hereafter, abbreviated as "embodiments") will be described.

1. A first embodiment includes detection of an interruption in the supply of alternating current on the basis of a time duration of a state).

2. A second embodiment includes detection of an interruption in the supply of alternating current on the basis of a time duration of a state or a peak value).

3. A third embodiment includes detection of an interruption in the supply of alternating current on the basis of a time duration including a normally high state of both voltages).

First Embodiment

"Electrical Device System Configuration"

FIG. 1 is a general overview illustrating an example configuration of an electrical device system. This electrical device system is provisioned with an AC/DC converter 100, a DC/DC converter 310, a photocoupler 320, and an electrical device 400.

The AC/DC converter 100 converts alternating current voltage ACIN into direct current voltage DCOUT. This AC/DC converter 100 supplies the alternating current voltage ACIN, for example, through a signal line 105 and 106 connected to the alternating current power supply such as a wall outlet. The alternating current voltage ACIN may be supplied from a so-called worldwide power supply to be used internationally as well. For example, the alternating current voltage ACIN has a sinusoidal form with a frequency between 47 and 63 Hz at a voltage between 85 and 264 volts. Further, the alternating current voltage ACIN to be supplied may have wider voltage and frequency range that the alternating current voltage of the worldwide power supply, or may be a narrower alternating current voltage such as may be used in commercial power supplies. This AC/DC converter 100 outputs the converted direct current voltage DCOUT to the DC/DC converter 310 through a signal line 107.

Also, the AC/DC converter 100 detects whether or not the supply of alternating current voltage ACIN has been interrupted due to an AC cable being pulled from the wall socket, power failure, etc., and generates a detection signal PON representing this detection result. This detection signal PON is configured, for example, to be at a low level when an interruption in the supply of alternating current power is detected, and configured to be at a high level when this condition is not met. The AC/DC converter 100 outputs this detection signal PON to the photocoupler 320 through a signal line 108. Also, the AC/DC converter 100 continues to supply the direct current voltage DCOUT to the electrical device 400 for a certain period of time from the interruption of the power supply. The length of this period has to be sufficiently long enough to enable the electrical device 400 to complete shutdown processing. This shutdown processing should be performed by the electrical device 400 before operation is terminated, and includes such operations as processing to close open files and save the contents of memory to a disk. Further, the AC/DC converter 100 is an example of an AC/DC converting device as disclosed herein.

The DC/DC converter 310 converts the direct current voltage DCOUT (100 V, for example) into a proper voltage for the electrical device 400 (12 V, for example). The DC/DC converter 310 outputs the direct current voltage DCOUT for which the voltage has been converted to the electrical device 400 through signal lines 318 and 319.

The photocoupler 320 transfers the detection signal PON to the electrical device 400 through a signal line 329. The photocoupler 320 is provisioned with a light-emitting element and a light-receiving element, and this the detection signal PON is converted into an optical signal by this light-emitting element, and the optical signal is converted into and output as an electrical signal by this light-receiving element. As a result, the input and output terminals of the photocoupler 320 are electrically insulated, which enables the transfer of the detection signal PON to the electrical device 400 even for cases in which the AC/DC converter has to be insulated.

The electrical device 400 operates by the direct current voltage DCOUT4 from the AC/DC converter 100. For example, the electrical device 400 is a video game console, television set, or similar. Also, the electrical device 400 executes a predetermined shutdown processing when the detection signal PON at a low level is received via the photocoupler 320 during operation.

"Configuration Example of the AC/DC Converter"

FIG. 2 is a block diagram illustrating an example configuration of the AC/DC converter 100. This AC/DC converter 100 is provisioned with an AC/DC converter unit 110, a half-wave rectifier unit 140, and a power supply monitoring circuit 200. The power supply monitoring circuit 200 is provisioned with a positive charge comparing unit 210, a negative charge comparing unit 220, and a power interruption detection circuit 240. Further, the AC/DC converter 100 is an example of an AC/DC converting device as disclosed herein.

The AC/DC converter unit 110 generates the direct current voltage DCOUT as a full-wave rectification of the alternating current voltage ACIN. The AC/DC converter unit 110 outputs the generated direct current voltage DCOUT to the DC/DC converter 310. Further, the AC/DC converter unit 110 is an example of an AC/DC converting unit as disclosed herein.

The half-wave rectifier unit 140 performs a half-wave rectification on the positive voltage of the alternating current voltage ACIN and the negative voltage of the alternating current voltage ACIN. Here, the positive voltage denotes that the alternating current voltage is higher than a predetermined reference voltage, and the negative voltage denotes that the alternating current voltage is lower than this reference voltage. The negative charge waveforms are cut from the alternating current voltage ACIN by half-wave rectification of the positive voltage to obtain a pulsating current of the positive charge. Further, the positive charge waveforms are cut from the alternating current voltage ACIN by half-wave rectification of the negative voltage to obtain a pulsating current of the negative charge.

The half-wave rectifier unit 140 supplies a positive charge pulsating current voltage VP to the positive charge comparing unit 210 through a signal line 148. Also, the half-wave rectifier unit 140 supplies the negative charge pulsating current voltage VN to the negative charge comparing unit 220 through a signal line 149.

The positive charge comparing unit 210 compares the value of the positive voltage or positive current of the alternating current for which the half-wave rectification has been performed. Here, the positive current denotes an alternating current having a positive voltage. For example, the positive charge comparing unit 210 compares the positive charge pulsating current voltage VP to a reference voltage Vref1. This positive charge comparing unit 210 is provisioned with a reference voltage supply source 211 and a comparator 212. The reference voltage supply source 211 supplies the reference voltage Vref1 to an inverted input terminal in the comparator 212. Here, the reference voltage Vref1 is configured, for example, to be lower than the peak voltage of the pulsating current voltage VP or VN.

The comparator 212 compares the positive charge pulsating current voltage VP with the reference voltage Vref1 and generates a comparison result P_high. The pulsating current voltage VP from the half-wave rectifier unit 140 is input into a non-inverted input terminal in this comparator 212, and the reference voltage Vref1 from the reference voltage supply source 211 is input into the inverted input terminal. The comparator 212 compares these inputs, generates the comparison result P_high, and supplies this to the power interruption detection circuit 240 through a signal line 219. For example, the comparator 212 generates the comparison result P_high at a high level when the pulsating current voltage VP is higher than the reference voltage Vref1, and generates the comparison result P_high at a low level when this condition is not met.

The negative charge comparing unit 220 compares the value of the negative voltage or negative current of the alternating current for which the half-wave rectification has been performed, with the reference value. Here, the negative current denotes an alternating current having a negative voltage. For example, the negative charge comparing unit 220 compares the negative charge pulsating current voltage VN to a reference voltage Vref1. This negative charge comparing unit 220 is provisioned with a reference voltage supply source 221 and a comparator 222. The reference voltage supply source 221 supplies the reference voltage Vref1 to an inverted input terminal in the comparator 222.

The comparator 222 compares the negative charge pulsating current voltage VN with the reference voltage Vref1 and outputs a comparison result N_high. The pulsating current voltage VN from the half-wave rectifier unit 140 is input into a non-inverted input terminal in this comparator 222, and the reference voltage Vref1 from the reference voltage supply source 221 is input into the inverted input terminal. The comparator 222 compares these inputs, generates the comparison result N_high, and supplies this to the power interruption detection circuit 240 through a signal line 229. For example, the comparator 222 generates the comparison result N_high at a high level when the pulsating current voltage VN is higher than the reference voltage Vref1, and generates the comparison result N_high at a low level when this condition is not met.

Further, the positive charge comparing unit 210 may be configured from digital circuits. For example, the positive charge comparing unit 210 may be provisioned with a circuit to perform A/D conversion on the analog pulsating voltage VP and a comparator to compare the converted voltage and the reference voltage Vref1 in place of the reference voltage supply source 211 and the comparator 212. Also, the power supply monitoring circuit 200 monitors the alternating current voltage, but the alternating current itself may be monitored instead of the alternating current voltage. In this case, the power supply monitoring circuit 200 detects whether or not the supply of alternating current power has been interrupted based on whether or not the time duration of a state in which the value of either the positive or negative current of alternating current with half-wave rectification is higher than the reference value is longer than a time shorter than the alternating current cycle.

The power interruption detection circuit 240 detects whether or not the supply of alternating current power has been interrupted on the basis of the comparison result P_high and N_high. For example, the power interruption detection circuit 240 obtains the time in which the state of the comparison result P_high continues at a high level (hereafter, abbreviated as "time duration when positive charge voltage is high"). Also, the power interruption detection circuit 240 obtains the time in which the state of the comparison result N_high continues at a high level (hereafter, abbreviated as "time duration when negative charge voltage is high"). Further, the power interruption detection circuit 240 obtains the time in which the state of both the comparison result P_high and N_high continue at a low level (hereafter, abbreviated as "time duration when both charge voltages are low").

Also, the power interruption detection circuit 240 obtains any of the time duration when the positive voltage is high, the time duration when the negative voltage is high, and the time duration when both charge voltages are low to detect whether or not the supply of alternating power current has been interrupted by whether or not this time duration is longer than a predetermined timeout. Here, the timeout time indicates the time in which a certain state is allowed to continue, and when a state continues for longer than the timeout time, this is detected as an interruption in the supply of alternating current power. The timeout time for each state is configured to be shorter than the cycle of the alternating current voltage ACIN. For example, The timeout time for the state in which only the comparison result P_high is at a high level and the state in which only the comparison result N_high is at a high level may be set to 13 milliseconds. Further, the timeout time for the state in which both the comparison result P_high and the comparison result N_high are at a low level may be set to 8 milliseconds for example. The power interruption detection circuit 240 generates the detection signal PON and supplies this to the photocoupler 320 on the basis of the detection result on whether or not the supply of alternating current power has been interrupted.

FIG. 3 is an example timing chart describing the time duration of each state. This timing chart illustrates examples of changes as time progresses for the positive charge pulsating current voltage VP, the negative charge pulsating current voltage VN, the comparison result P_high, and the comparison result N_high.

Regarding the period from when the supply of alternating current starts until the positive charge pulsating current voltage VP is higher than the reference voltage Vref1, the pulsating current voltage VP and the negative charge pulsating current voltage VN are both at or below the reference voltage Vref1, and the comparison result P_high and comparison result N_high are both at a low level. The time duration for this state is counted as the time duration when both charge voltages are low.

Also, the period from the time in which the positive charge pulsating current voltage VP is higher than the reference voltage Vref1 until the positive charge pulsating current voltage VP peaks and falls back to at or below the reference voltage Vref1 is output by the comparator 212 as the comparison result P_high at a high level. The time duration of this state is counted as the time duration when the positive voltage is high.

When the positive charge pulsating current voltage VP peaks and then falls back down to at or below the reference voltage Vref1, the comparison result P_high and the comparison result N_high are both at a low level. For this reason, a state machine circuit 242 transitions to the time duration when both charge voltages are low.

Also, the period from the time in which the negative charge pulsating current voltage VN is higher than the reference voltage Vref1 until the negative charge pulsating current voltage VN peaks and falls back to at or below the reference voltage Vref1 is output by the comparator 222 as the comparison result N_high at a high level. The time duration of this state is counted as the time duration when the negative voltage is high.

In this way, the power interruption detection circuit 240 counts the time duration when the positive voltage is high, the time duration when both charge voltages are low, and the time duration when the negative voltage is high in this order.

"Configuration Example of AC/DC Converter Unit"

FIG. 4 is a circuit diagram illustrating an example configuration of the AC/DC converter unit 110. This AC/DC converter unit 110 is provisioned with a rectifier circuit 120 and a transformer circuit 130.

The rectifier circuit 120 performs a full-wave rectification on the alternating current voltage ACIN. This rectifier circuit 120 is provisioned with diodes 121 through 124, which are elements having a rectifier action. The anode of the diodes 123 and 124 are connected to the reference voltage. The cathode of the diode 123 is connected to a signal line 105 and the anode of the diode 121, and the cathode of the diode 124 is connected to a signal line 106 and the anode of the diode 122. Also, the cathode of the diode 121 and 122 is connected to the transformer circuit 130.

Such a configuration enables the alternating current voltage ACIN to be processed with full-wave rectification. For example, current flows through the diodes 121 and 123 in a forward direction for one cycle of either the positive charge or the negative charge of the alternating current voltage ACIN, and current flows through the diodes 122 and 124 in a forward direction for the other cycle. The result is that the waves of both the positive charge and the negative charge are processed with rectification, which generates the pulsating current.

Further, the rectifier circuit 120 performs full-wave rectification on the alternating current voltage ACIN, but the pulsating current may also be generated by performing a half-wave rectification on the alternating current voltage ACIN.

The transformer circuit 130 raised or lowers the voltage of the pulsating current to generate the direct current voltage DCOUT. This transformer circuit 130 is provisioned with a choke coil 131 and a block condenser 132. One end of the choke coil 131 is connected to the rectifier circuit 120, and the other end is connected to the block condenser 132. Also, one end of the block condenser 132 is connected to the reference voltage, and the other end is connected to a signal line 107 and the choke coil 131.

Such a configuration enables the direct current voltage DCOUT to be generated from the pulsating current. For example, the block condenser 132 charges when the pulsating current is high and discharges when it is low to try to smooth out the difference between the high and low values of the pulsating current. The voltage waveform which is close to smooth due to charging and discharging of the block condenser 132 may have some fluctuations remaining, but such ripples are removed by the choke coil 131.

Also, when the supply of alternating current voltage ACIN is interrupted, the AC/DC converter 100 may continue to supply direct current voltage DCOUT by discharging the electric power charged in the block condenser 132 for a period of time equal to the capacity of the block condenser 132. As previously described, this period has to be long enough for the electrical device 400 to complete the shutdown processing. Therefore, it would seem better if the capacity of the block condenser 132 is large, but it is actually preferable to reduce the capacity of the block condenser 132 as the size and cost of the block condenser 132 is one part that represents a substantial portion of the AC/DC converter 100. In order to reduce the capacity of the block condenser 132, the time to detect that the supply of alternating current voltage ACIN power has been interrupted has to be shorter, and time until the electrical device 400 begins the shutdown processing also has to be reduced.

Configuration Example of Half-Wave Rectifier Unit

FIG. 5 is a circuit diagram illustrating an example configuration of the half-wave rectifier unit 140. This half-wave rectifier unit 140 is provisioned with a positive half-charge rectifier unit 150 and a negative half-wave rectifier unit 160.

The positive half-charge rectifier unit 150 performs half-wave rectification on the alternating current voltage ACIN during the period at a positive charge. The positive half-wave rectifier unit 150 is provisioned with a diode 151 and resistors 152 and 153. The diode 151 is an element having a rectifier action, and its anode is connected to the alternating current power through the signal line 105, and the cathode is connected to the resistor 152.

The resistors 152 and 153 are connected in series inserted between the diode 151 and the reference voltage. Also, the positive charge comparing unit 210 is connected to connection nodes of the resistors 152 and 153 through the signal line 148. The resistance values of the resistors 152 and 153 are configured so that the voltage after half-wave rectification fits within the voltage range allowed by the power supply monitoring circuit 200. Further, a configuration without resistors 152 and 153 may be used when the voltage to which the half-wave rectification has been performed by the diode 151 is within the allowable voltage range.

Such a configuration enables current to flow in a forward direction of the diode 151 only during the period in which the alternating current voltage ACIN has a positive charge. As a result, the negative waveform of the alternating current voltage ACIN is cut, and the voltage produced as a result of positive charge half-wave rectification on the alternating current voltage ACIN is supplied as the positive charge pulsating current voltage VP.

The negative half-charge rectifier unit 160 performs half-wave rectification on the alternating current voltage ACIN during the period at a negative charge. The negative half-charge rectifier unit 160 is provisioned with a diode 161 and resistors 162 and 163. The diode 161 is an element having a rectifier action, and its anode is connected to reference potential of the alternating current power through the signal line 106, and the cathode is connected to the resistor 162.

The resistors 162 and 163 are connected in series inserted between the diode 161 and the reference potential. Also, the negative charge comparing unit 220 is connected to connection nodes of the resistors 162 and 163 through the signal line 149. The resistance values of the resistors 162 and 163 are configured so that the voltage after half-wave rectification fits within the voltage range allowed by the power supply monitoring circuit 200. Further, a configuration without resistors 162 and 163 may be used when the voltage to which the half-wave rectification has been performed by the diode 161 is within the allowable voltage range.

Such a configuration enables current to flow in a forward direction of the diode 161 during the period in which the alternating current voltage ACIN has a negative charge. As a result, the positive waveform of the alternating current voltage ACIN is cut, and the voltage produced as a result of negative charge half-wave rectification on the alternating current voltage ACIN is supplied as the negative charge pulsating current voltage VN.

"Configuration Example of Power Supply Monitoring Circuit"

FIG. 6 is a block chart illustrating an example configuration of the power interruption detection circuit 240 with a sampling circuit 241, a state machine circuit 242, and a state time duration counter 243.

The sampling circuit 241 samples the comparison result P_high and N_high, and outputs this to the state machine 242. Also, the sampling circuit 241 uses a digital filter to remove noise superimposed into the comparison result P_high and N_high. As a result, chattering in the comparison result P_high and N_high is prevented. The digital filter is a noise filter provisioned with a multi-stage shift register, and a circuit to determine matches and mismatches for each stage of this shift register. Further, the sampling circuit 241 may be configured without the digital filter to remove noise.

The state machine circuit 242 detects whether or not the supply of alternating current power has been interrupted on the basis of the comparison result P_high and N_high. For example, the state machine circuit 242 instructs the state time duration counter 243 to count the time duration of the state at which only the comparison result P_high is at a high level, and to count the time duration of the state at which only the comparison result N_high is at a high level. Also, the state machine circuit 242 outputs the detection signal PON at a low level when these states continue longer than a predetermined timeout time (13 milliseconds, for example).

Also, the state machine circuit 242 instructs the state time duration counter 243 to count the time duration of the state at which both the comparison result P_high and N_high are at a low level. Also, the state machine circuit 242 outputs the detection signal PON at a low level when this state continues longer than a predetermined timeout time (8 milliseconds, for example).

The state time duration counter 243 counts the time duration for these state according to the control of the state machine circuit 242.

Further, a portion of or all of the power interruption detection circuit 240 may be configured from analog circuits. For example, a timer circuit using the time of condenser charges and discharges may be provisioned in place of the state time duration counter 243.

FIG. 7 is a block diagram illustrating an example of the power interruption detection circuit 240. The power interruption detection circuit 240 includes a positive-charge high-voltage time duration obtaining unit 244, a negative-charge high-voltage time duration obtaining unit 245, a both-charges low-voltage time duration obtaining unit 246, and a power supply interruption detection unit 247.

The positive-charge high-voltage time duration obtaining unit 244 obtains the time duration of the state at which the comparison result P_high is at a high level, e.g., the time duration when the positive charge has a high voltage. The negative-charge high-voltage time duration obtaining unit 245 obtains the time duration of the state at which the comparison result N_high is at a high level, e.g., the time duration when the negative charge has a high voltage. The both-charges low-voltage time duration obtaining unit 246 obtains the time duration of the state at which both the comparison result P_high and N_high are at a low level, e.g., the time duration when both charges have a low voltage.

Further, the positive-charge high-voltage time duration obtaining unit 244 and negative-charge high-voltage time duration obtaining unit 245 are examples of time duration obtaining units as disclosed herein.

The power supply interruption detection unit 247 detects an interruption in the supply of alternating current power when the time duration of the positive charge has a high voltage, the time duration of the negative charge has a high voltage, or the time duration of both charges have a low voltage are longer than the predetermined timeout time.

The operations of the positive-charge high-voltage time duration obtaining unit 244, negative-charge high-voltage time duration obtaining unit 245, and both-charges low-voltage time duration obtaining unit 246 in FIG. 7 may be achieved by the state machine circuit 242 and state time duration counter 243 in FIG. 6. Also, the operations of the power supply interruption detection unit 247 in FIG. 7 may be achieved by the state machine circuit 242 in FIG. 6.

"Operational Example of Power Supply Monitoring Circuit"

FIG. 8 is a diagram of transitional states illustrating example operations of the state machine circuit 242. The state machine circuit 242 transitions to a normal state when an interruption in the supply of alternating current power is not detected, and transitions to an abnormal state when an interruption in alternating current power supply is detected. The state machine circuit 242 outputs the detection signal PON at a high level during the normal state, and the state machine circuit 242 outputs the detection signal PON at a low level during the abnormal state.

Normal states include an initial state 601, a normal state when both charges have low voltage 602, a normal state when positive charge has high voltage 603, and a normal state when negative charge has a high voltage 604. Further, abnormal states include an abnormal state when both charges have low voltage 605, an abnormal state when positive charge has high voltage 606, and an abnormal state when negative charge has high voltage 607.

Once the alternating current power is supplied, the state machine circuit 242 transitions to the initial state 601. Also, when both the comparison result P_high or N_high are at a low level during the initial state 601, the state machine circuit 242 transitions to the normal state when both charges have low voltage 602. Also, when the comparison result P_high is at a high level and the comparison result N_high is at a low level during the initial state 601, the state machine circuit 242 transitions to the normal state when positive charge has high voltage 603. Also, when the comparison result N_high is at a high level and the comparison result P_high is at a low level during the initial state 601, the state machine circuit 242 transitions to the normal state when negative charge has a high voltage 604.

When both the comparison result P_high and N_high are at a low level during the normal state when both charges have low voltage 602, the state machine circuit 242 maintains the normal state when both charges have low voltage 602. When the normal state when both charges have low voltage 602 is longer than the predetermined timeout time (8 milliseconds, for example), the state machine circuit 242 transitions to the abnormal state when both charges have low voltage 605. Also, when the comparison result P_high changes to a high level within the predetermined timeout time during the normal state when both charges have low voltage 602, the state machine circuit 242 transitions to the normal state when positive charge has high voltage 603. Further, when the comparison result N_high changes to a high level within the predetermined timeout time during the normal state when both charges have low voltage 602, the state machine circuit 242 transitions to the normal state when negative charge has a high voltage 604.

When the comparison result P_high is at a high level and the comparison result N_high is at a low level during the normal state when positive charge has high voltage 603, the state machine circuit 242 maintains the normal state when positive charge has high voltage 603. When the normal state when positive charge has high voltage 603 continues for longer than the predetermined timeout time (13 milliseconds, for example), the state machine circuit 242 transitions to the abnormal state when positive charge has high voltage 606. Also, when the comparison result P_high changes to a low level within the predetermined timeout time during the normal state when positive charge has high voltage 603, the state machine circuit 242 transitions to the normal state when both charges have low voltage 602. Also, when the comparison result N_high changes to a high level within the predetermined timeout time during the normal state when positive charge has high voltage 603, the state machine circuit 242 transitions to the normal state when negative charge has a high voltage 604.

When the comparison result P_high is at a low level and the comparison result N_high is at a high level during the normal state when negative charge has a high voltage 604, the state machine circuit 242 maintains the normal state when negative charge has a high voltage 604. When the normal state when negative charge has a high voltage 604 continues for longer than the predetermined timeout time (13 milliseconds, for example), the state machine circuit 242 transitions to the abnormal state when negative charge has high voltage 607. Also, when the comparison result N_high changes to a low level within the predetermined timeout time during the normal state when negative charge has a high voltage 604, the state machine circuit 242 transitions to the normal state when both charges have low voltage 602. When the comparison result P_high changes to a high level within the predetermined timeout time during the normal state when negative charge has a high voltage 604, the state machine circuit 242 transitions to the normal state when positive charge has high voltage 603.

When both the comparison result P_high and N_high are at a low level during the abnormal state when both charges have low voltage 605, the state machine circuit 242 maintains the abnormal state when both charges have low voltage 605. Also, when the comparison result P_high changes to a high level during the abnormal state when both charges have low voltage 605, the state machine circuit 242 transitions to the normal state when positive charge has high voltage 603. Further, then the comparison result N_high changes to a high level during the abnormal state when both charges have low voltage 605, the state machine circuit 242 transitions to the normal state when negative charge has a high voltage 604.

When the comparison result P_high is at a high level and the comparison result N_high is at a low level during the abnormal state when positive charge has high voltage 606, the state machine circuit 242 maintains the abnormal state when positive charge has high voltage 606. When the comparison result P_high changes to a low level during the abnormal state when positive charge has high voltage 606, the state machine circuit 242 transitions to the abnormal state when both charges have low voltage 605.

When the comparison result P_high is at a low level and the comparison result N_high is at a high level during the abnormal state when negative charge has high voltage 607, the state machine circuit 242 maintains the abnormal state when negative charge has high voltage 607. When the comparison result N_high changes to a low level during the abnormal state when negative charge has high voltage 607, the state machine circuit 242 transitions to the abnormal state when both charges have low voltage 605.

In this way, the state machine circuit 242 obtains the time duration for the states enclosed within the dotted lines in FIG. 8, e.g., the normal state when both charges have low voltage 602, the normal state when positive charge has high voltage 603, and the normal state when negative charge has a high voltage 604. Also, when the obtained time duration is longer than the timeout time, which is shorter than the alternating current voltage ACIN cycle, the state machine circuit 242 detects that the supply of alternating current power has been interrupted. As a result, the power supply monitoring circuit 200 may detect that the supply of alternating current power has been interrupted at a time shorter than the alternating current voltage ACIN cycle.

FIG. 9 is a flowchart illustrating example operations of the power supply monitoring circuit 200. These operations may start when the alternating current power is supplied to the power supply monitoring circuit 200, for example.

The power supply monitoring circuit 200 compares the positive charge pulsating current voltage VP and the reference voltage Vref1 (step S901). Also, the power supply monitoring circuit 200 executes a power supply interruption detection processing to detect the interruption in the supply of alternating current power (step S910). When the alternating current power supply continues to be input normally, the power supply monitoring circuit 200 compares the negative charge pulsating current voltage VN and the reference voltage Vref1 (step S902). Then, the power supply monitoring circuit 200 executes the power supply interruption detection processing (step S910). After the step S910, the power supply monitoring circuit 200 returns to the step S901.

FIG. 10 is a flowchart illustrating an example of the power supply interruption detection processing. The power interruption detection circuit 240 in the power supply monitoring circuit 200 determines whether or not the positive charge pulsating current voltage VP and the negative charge pulsating current voltage VN are both at or below the reference voltage Vref1 (step S911).

When the positive charge pulsating current voltage VP and the negative charge pulsating current voltage VN are both at or below the reference voltage Vref1 (Yes in step S911), the power interruption detection circuit 240 transitions to the normal state when both charges have low voltage, and counts the time duration of this state using the state time duration counter 243. If this is a transfer from another state, the power interruption detection circuit 240 resets the count value of the state time duration counter 243 to an initial value (zero, for example) before starting the count. Also, the power interruption detection circuit 240 outputs the detection signal PON at a high level (step S912). Then, the power interruption detection circuit 240 determines whether or not the normal state when both charges have low voltage continues for longer than 8 milliseconds (step S913). When the time duration of the normal state when both charges have low voltage is not longer than 8 milliseconds (No in step S913), the power interruption detection circuit 240 returns to step S911.

When either the positive charge pulsating current voltage VP or negative charge pulsating current voltage VN is higher than the reference voltage Vref1 (No in step S911), the power interruption detection circuit 240 determines whether or not only the positive charge pulsating current voltage VP is higher than the reference voltage Vref1 (step S914). When only the positive charge pulsating current voltage VP is higher than the reference voltage Vref1 (Yes in step S914), the power interruption detection circuit 240 transitions to the normal state when positive charge has high voltage, and counts the time duration of this state using the state time duration counter 243. If this is a transfer from another state, the power interruption detection circuit 240 resets the count value of the state time duration counter 243 to an initial value before starting the count. Then, the power interruption detection circuit 240 outputs the detection signal PON at a high level (step S915). Then, the power interruption detection circuit 240 determines whether or not the normal state when positive charge has high voltage continues for longer than 13 milliseconds (step S916). When the time duration of the normal state when positive charge has high voltage is not longer than 13 milliseconds (No in step S916), the power interruption detection circuit 240 returns to step S911.

When only the positive charge pulsating current voltage VP is not higher than the reference voltage Vref1 (No in step S914), the power interruption detection circuit 240 determines whether or not only the negative charge pulsating current voltage VN is higher than the reference voltage Vref1 (step S917). When both the positive charge pulsating current voltage VP and negative charge pulsating current voltage VN are higher than the reference voltage Vref1 (No in step S917), the power interruption detection circuit 240 returns to step S911. When only the negative charge pulsating current voltage VN is higher than the reference voltage Vref1 (Yes in step S917), the power interruption detection circuit 240 transitions to the normal state when negative charge has high voltage, and counts the time duration of this state using the state time duration counter 243. If this is a transfer from another state, the power interruption detection circuit 240 resets the count value of the state time duration counter 243 to an initial value before starting the count. Then, the power interruption detection circuit 240 outputs the detection signal PON at a high level (step S918). Then, the power interruption detection circuit 240 determines whether or not the normal state when negative charge has high voltage continues for longer than 13 milliseconds (step S919). When the time duration of the normal state when negative charge has high voltage is not longer than 13 milliseconds (No in step S919), the power interruption detection circuit 240 returns to step S911.

When the normal state when both charges have low voltage continues longer than 8 milliseconds (Yes in step S913), the power interruption detection circuit 240 detects an interruption in the supply of alternating current power, and outputs the detection signal PON at a low level (step S920). When either the normal state when positive charge has high voltage or the normal state when negative charge has high voltage continues longer than 13 milliseconds (Yes in step S916 or S919), the power interruption detection circuit 240 transitions to an abnormal state and detects an interruption in the supply of alternating current power (step S920). Then, the power interruption detection circuit 240 determines whether or not the positive charge pulsating current voltage VP and the negative charge pulsating current voltage VN are higher than the reference voltage Vref1 (step S927). When either the positive charge pulsating current voltage VP or negative charge pulsating current voltage VN is higher than the reference voltage Vref1 (No in step S927), the power interruption detection circuit 240 returns to step S927. When the positive charge pulsating current voltage VP and negative charge pulsating current voltage VN are at or less than the reference voltage Vref1 (Yes in step S927), the power interruption detection circuit 240 transitions to the abnormal state when both charges have low voltage. The power interruption detection circuit 240 determines whether or not only the negative charge pulsating current voltage VN has become higher than the reference voltage Vref1 during this abnormal state when both charges have low voltage (step S928). When only the negative charge pulsating current voltage VN has become higher than the reference voltage Vref1 (Yes in step S928), the power interruption detection circuit 240 returns to step S918. When only the negative charge pulsating current voltage VN is has not become higher than the reference voltage Vref1 (No in step S928), the power interruption detection circuit 240 determines whether or not only the positive charge pulsating current voltage VP is higher than the reference voltage Vref1 (step S929). When only the positive charge pulsating current voltage VP has become higher than the reference voltage Vref1 (Yes in step S929), the power interruption detection circuit 240 returns to step S915. When only the positive charge pulsating current voltage VP and VN has not become higher than the reference voltage Vref1 (No in step S929), the power interruption detection circuit 240 returns to step S928.

FIG. 11 is a diagram illustrating an example waveform of the alternating current. The vertical axis in FIG. 11 represents the voltage, and the horizontal axis represents the time. A voltage waveform 501 in FIG. 11 is an example waveform of the alternating current voltage ACIN having a sine waveform. A voltage waveform 511 in FIG. 11 is an example waveform of the alternating current voltage ACIN having a square waveform. The voltage waveform of the alternating current voltage ACIN may be a waveform other than that illustrated in FIG. 11.

A voltage waveform 502 in FIG. 11 illustrates an example of a waveform of the positive charge pulsating current voltage VP generated by a half-wave rectification of the positive voltage. The half-wave rectification of the positive voltage cuts the negative charge waveform of the alternating current voltage ACIN to obtain the positive charge pulsating current voltage VP.

A voltage waveform 503 in FIG. 11 illustrates an example of a waveform of the negative charge pulsating current voltage VN generated by a half-wave rectification of the negative voltage of the alternating current voltage ACIN. The half-wave rectification of the negative voltage cuts the positive charge waveform of the alternating current voltage ACIN to obtain the negative charge pulsating current voltage VN.

FIG. 12 is a diagram illustrating an example of the waveform of the pulsating current and direct current voltage DCOUT. The vertical axis in FIG. 12 represents the voltage, and the horizontal axis represents the time. A voltage waveform 504 in FIG. 11 is an example waveform of pulsating voltage generated by full-wave rectification of the alternating current voltage ACIN. This full-wave rectification yields pulsating voltage of both negative and positive side waveforms.

The direct current voltage DCOUT in FIG. 12 is an example of direct current voltage generated from the pulsating current voltage. As illustrated in FIG. 12, the direct current voltage DCOUT of a constant voltage may be obtained from the pulsating current voltage.

FIG. 13 is a timing chart illustrating example operations of the power supply monitoring circuit 200. This timing chart illustrates an example of changes that occur over time regarding the positive charge pulsating current voltage VP, the negative charge pulsating current voltage VN, the comparison result P_high, the comparison result N_high, the state machine circuit 242, and the detection signal PON.

During the period from when the supply of alternating current power starts until the positive charge pulsating current voltage VN becomes higher than the reference voltage Vref1, both the positive charge pulsating current voltage VP and the negative charge pulsating current voltage VN are at or below the reference voltage Vref1, and the comparison result P_high and N_high are both at a low level. For this reason, the state machine circuit 242 transitions to the normal state when both charges have low voltage, and outputs the detection signal PON at a high level.

Then, once the positive charge pulsating current voltage VP becomes higher than the reference voltage Vref1, the comparator 212 outputs the comparison result P_high at a high level. For this reason, the state machine circuit 242 transitions to the normal state when positive charge has high voltage.

After the positive charge pulsating current voltage VP peaks and falls back to at or below the reference voltage Vref1, both the comparison result P_high and N_high are at a low level. For this reason, the state machine circuit 242 again transitions to the normal state when both charges have low voltage.

Then, once the negative charge pulsating current voltage VN becomes higher than the reference voltage Vref1, the comparator 222 outputs the comparison result N_high at a high level. For this reason, the state machine circuit 242 transitions to the normal state when negative charge has high voltage.

In this way, when the alternating current is supplied, the positive charge and negative charge of the pulsating current alternate between becoming higher than the reference voltage Vref1. For this reason, the state of the state machine circuit 242 transition cyclically between the normal state when positive charge has high voltage, the normal state when both charges have low voltage, and the normal state when negative charge has high voltage. The time duration of these states are shorter than the cycle of the alternating current voltage ACIN, and so an interruption in the supply of alternating power is not detected.

FIG. 14 is a timing chart of example operations of the power supply monitoring circuit 200 when the shape of the power waveform is unstable. This timing chart illustrates an example of changes that occur over time regarding the positive charge pulsating current voltage VP, the negative charge pulsating current voltage VN, the comparison result P_high, the comparison result N_high, the state machine circuit 242, and the detection signal PON.

As previously described, if there is a floating capacitance in the wiring path to which the pulsating current voltage VP and pulsating current voltage VN is applied, or when an offset voltage is generated in the rectifier current circuit for performing rectification of the alternating current, the form of the voltage waveform becomes unstable, and a cycle may occur in which the peak of the pulsating current voltage does not decrease significantly. For example, a cycle may occur in which the peaks of the pulsating current voltage VP and pulsating current voltage VN do not lower significantly. As illustrated in FIG. 14, during such a cycle, after the positive charge pulsating current voltage VP peaks and before it falls back to at or below the reference voltage Vref1, the negative charge pulsating current voltage VN becomes higher than the reference voltage Vref1. For this reason, the state machine circuit 242 does not transition to the state when both charges have low voltage, and instead transitions directly from the normal state when positive charge has high voltage to the normal state when negative charge has high voltage.

In this way, even in a case of directly transitioning from the normal state when positive charge has high voltage, to the normal state when negative charge has high voltage, the state machine circuit 242 resets the state time duration counter 243 before transitioning to the normal state when negative charge has high voltage, and starts the count of the time duration for the normal state when negative charge has high voltage. Therefore, when the timeout time for the normal state when negative charge has high voltage is shorter than the cycle of the alternating current voltage, the power supply monitoring circuit 200 does not mistakenly detect an interruption in the supply of the alternating current.

In contrast, at the power supply device comparing the pulsating current produced from the full-wave rectification of the alternating current voltage and the reference voltage Vref1, the timeout time being shorter than the cycle of the alternating current voltage creates a problem. The normal state when positive charge has high voltage and normal state when negative charge has high voltage are not differentiated, and thus when the resulting time duration is a count of both of these, so when the timeout time is shorter than the cycle of the alternating current voltage, a false interruption in the supply of alternating current power may be detected for cycles in which the peaks of the pulsating current are not significantly low.

FIG. 15 is a timing chart illustrating example operations of the power supply monitoring circuit 200 when an interruption in the supply of alternating current power due to the connection of a heavy load is detected. This timing chart illustrates an example of changes that occur over time regarding the positive charge pulsating current voltage VP, the negative charge pulsating current voltage VN, the comparison result P_high, the comparison result N_high, the state machine circuit 242, and the detection signal PON. For example, the heavy load on the alternating current power supply here is a circuit other than the block condenser 132 in the AC/DC converter 100, or the electrical device 400.

When a heavy load is connected to the alternating current power supply and the supply of power from this alternating power supply is interrupted, the time that power may continue to be supplied to the block condenser 132 is shorter than when a light load is connected. This is due to the fact that the consumed power of the heavy load is large, and the energy accumulated in the block condenser 132 is consumed at a high rate. As a result, the rate of the decrease in the pulsating current is faster as compared to when the load is light.

For example, let us say that the supply of alternating current power has been interrupted when the negative charge pulsating current voltage VN is at a peak voltage. In this case, as illustrated in FIG. 15, the negative charge pulsating current voltage VN is at or below the reference voltage Vref1 for a short time. For this reason, the time duration when the negative charge has high voltage is within the timeout time, and so at the state when the negative charge pulsating current voltage VN is higher than the reference voltage Vref1, an interruption in the supply of alternating current power is not detected.

Then, the negative charge pulsating current voltage VN continues to decrease lower than the reference voltage Vref1. Further, the positive charge pulsating current voltage VP continues to be at the reference voltage (0 V, for example). For this reason, the state machine circuit 242 transitions to the normal state when both charges have low voltage, and after a certain amount of time passes, transitions to the abnormal state when both charges have low voltage. When transitioning to the abnormal state when both charges have low voltage, an interruption in the supply of alternating current power is detected, and the detection signal PON changes to a low level.

In this way, an interruption in the supply of alternating current power due to the connection of heavy load is detected quickly and accurately.

FIG. 16 is a timing chart illustrating example operations of the power supply monitoring circuit 200 when an interruption in the supply of alternating current power due to a connection of a light load is detected. This timing chart illustrates changes that occur over time regarding the positive charge pulsating current voltage VP, the negative charge pulsating current voltage VN, the comparison result P_high, the comparison result N_high, the state machine circuit 242, and the detection signal PON.

When a light load is connected to the alternating current power supply, and the supply of power from this alternating current power supply is interrupted, the energy accumulated in the block condenser 132 is consumed at a slow rate, and so the rate of the decrease in the pulsating current is slower as compared to when the load is heavy.

For example, let us say that the supply of alternating current power has been interrupted when the negative charge pulsating current voltage VN is at a peak voltage. In this case, as illustrated in FIG. 16, the negative charge pulsating current voltage VN decreases slowly, and so the time duration when the pulsating current voltage VN is at a higher state than the reference voltage Vref1 is longer than the timeout time. For this reason, when the time duration when the negative charge has high voltage is longer than the timeout time, the state machine circuit 242 transitions to the abnormal state when negative charge has high voltage. When transitioning to the abnormal state when negative charge has high voltage, an interruption in the supply of alternating current power is detected, and the detection signal PON changes to a low level. This timeout time is shorter than the cycle of the alternating current voltage ACIN, and so the AC/DC converter 100 to which the light load is connected may detect the interruption in the supply of the alternating current power at a time shorter than the cycle of the alternating current voltage ACIN.

FIG. 17 is a timing chart illustrating example operations of a power supply monitoring circuit when the supply of alternating current power is interrupted at a timing when the voltage is not at the peak voltage. This timing chart illustrates changes that occur over time regarding the positive charge pulsating current voltage VP, the negative charge pulsating current voltage VN, the comparison result P_high, the comparison result N_high, the state machine circuit 242, and the detection signal PON.

When the supply of alternating current power is interrupted at a timing when the voltage is not at the peak voltage regarding a configuration in which a light load is connected, the time duration when negative charge has high voltage is shorter than when the supply is interrupted at the peak voltage. When the shortened time duration when negative charge has high voltage is longer than the timeout time of this state, the state machine circuit 242 transitions to the abnormal state when negative charge has high voltage and detects an interruption in the supply of the alternating current power. Further, when the shortened time duration when negative charge has high voltage is within the timeout time of the abnormal state when negative charge has high voltage, the state machine circuit 242 transitions to the normal state when both charges have low voltage, and detects an interruption in the supply of alternating current power after elapsing of the timeout time in that state. In either case, the interruption in the supply of alternating current power is detected within the time of the cycle of the alternating current voltage ACIN. Therefore, the power supply monitoring circuit 200 may quickly detect interruptions in the supply of alternating current power regardless of the timing at which the supply of voltage has been interrupted.

According to the first embodiment of the disclosed, in this way, the power supply monitoring circuit 200 may detect whether or not the supply of alternating current voltage has been interrupted by whether or not the time duration of the state at which the alternating current voltage which has been processed with half-wave rectification is higher than the reference voltage is longer than a time shorter than the cycle of the alternating current voltage. As a result, interruptions in the supply of alternating current power may be detected at a time shorter than the cycle of the alternating current even for power supply boards that do not have a PFC installed.

For configurations counting the time duration for the state at which the alternating current voltage which has been processed with full-wave rectification is higher than the reference voltage, the detection of interruptions in the supply of alternating current voltage at a time shorter than the cycle of the alternating current is a problem. As illustrated in FIG. 14, this causes false detections of interruptions in the supply of alternating current power when the timeout time is shorter than the cycle of the alternating current voltage for cycles in which the peak voltage of the pulsating do not significantly decrease.

Second Embodiment

"Example Configuration of Power Supply Monitoring Circuit"

FIG. 18 is block diagram illustrating an example configuration of a power supply monitoring circuit 200. According to the first embodiment, when the time duration of various states of decreases in the peak voltage of the alternating current voltage ACIN are within the timeout time, the power supply monitoring circuit 200 determines that the alternating current power is being supplied, and does not detect an interruption in the supply of the alternating current power. However, when the peak voltage of the alternating current voltage ACIN decreased to a point less than a certain voltage such as the minimum operation voltage of the electrical device 400 even though the time duration of each state is within the timeout time, this may be interpreted as a virtual interruption in the supply of power. The power supply monitoring circuit 200 according to the second embodiment also detects an interruption in the supply of alternating current power when the peak voltage of the alternating current voltage ACIN becomes less than a certain voltage. For example, the power supply monitoring circuit 200 according to the second embodiment is further provisioned with an OR gate 230. Also, the power supply monitoring circuit 200 according to the second embodiment includes a positive charge comparing unit 210 which is further provisioned with a reference voltage supply source 213 and a comparator 214, and a negative charge comparing unit 220 which is further provisioned with a reference voltage supply source 223 and a comparator 224.

The reference voltage supply source 213 and 223 supply a reference voltage Vref2, which is different from the reference voltage Vref1. The reference voltage Vref2 is configured, for example, to a divided voltage value of the alternating current voltage ACIN that guarantees a minimum operational voltage for the electrical device 400.

The comparator 214 compares the positive charge pulsating current voltage VP and the reference voltage Vref2. The positive charge pulsating current voltage VP from the half-wave rectifier unit 140 is input into the non-inverted input terminal of this comparator 214, and the reference voltage Vref2 from the reference voltage supply source 213 is input into the inverted input terminal. The comparator 214 compares these inputs, and supplies a comparison result to the OR gate 230. For example, when the positive charge pulsating current voltage VP is at or above the reference voltage Vref2, the comparator 214 generates the comparison result at a high level, and generates the comparison result at a low level when this condition is not met.

The comparator 224 compares the negative charge pulsating current voltage VN and the reference voltage Vref2. The negative charge pulsating current voltage VN from the half-wave rectifier unit 140 is input into the non-inverted input terminal of this comparator 224, and the reference voltage Vref2 from the reference voltage supply source 223 is input into the inverted input terminal. The comparator 224 compares these inputs, and supplies a comparison result to the OR gate 230. For example, when the negative charge pulsating current voltage VN is at or above the reference voltage Vref2, the comparator 224 generates the comparison result at a high level, and generates the comparison result at a low level when this condition is not met.

The OR gate 230 outputs a logical sum of the input value. The comparison results from the comparator 214 and comparator 224 are input in this OR gate 230. The OR gate 230 supplies these logical sums to the power interruption detection circuit 240 as a comparison result A_high. The comparison result A_high is a signal that changes to a high level when either the positive charge pulsating current voltage VP or negative charge pulsating current voltage VN are at or above the reference voltage Vref2, and changes to a low level when the positive charge pulsating current voltage VP and negative charge pulsating current voltage VN are both lower than the reference voltage Vref2.

When the peak voltage of the positive charge pulsating current voltage VP and the negative charge pulsating current voltage VN are at or above the reference voltage Vref2, the time duration of the state at which the pulsating current voltages VP and VN are lower than the reference voltage Vref2 is shorter than a certain amount of time depending on the cycle of the alternating current voltage ACIN. However, when the peak voltage of the pulsating current voltages VP and VN fall below the reference voltage Vref2 during some cycle, the peak voltage of the pulsating current voltages VP and VN continue lower than the reference voltage Vref2 from this cycle onward. For this reason, the power supply monitoring circuit 200 may detect the state at which both the pulsating current voltages VP and VN are lower than the reference voltage Vref2, e.g., whether or not the peak voltage is lower than the reference voltage Vref2 from the time the state at which the comparison result A_high continues at a low level.

The power interruption detection circuit 240 further counts the time duration that the state which the comparison result A_high continues at a low level. When the time duration of the state at which the comparison result A_high is at a low level is longer than a certain amount of time, the power interruption detection circuit 240 detects an amplitude abnormality in the alternating current power supply.

(Configuration Example of Power Supply Interruption Detection Circuit)

FIG. 19 is a block diagram illustrating an example configuration of the power interruption detection circuit 240. The power interruption detection circuit 240 is further provisioned with a peak value monitoring circuit 251, a decreased peak value time counter 252, and an AND (logical product) gate 253.

The peak value monitoring circuit 251 monitors the peak voltage of the pulsating current voltage VP and VN produced from the half-wave rectification of the alternating current voltage ACIN, and detects whether or not this value is at or below the reference voltage Vref2. For example, the peak value monitoring circuit 251 instructs the decreased peak value time counter 252 to count a decreased peak value time, which is the time duration of the state at which the comparison result A_high is at a low level. Also, the peak value monitoring circuit 251 generates a detection signal aPON, and supplies this to the AND gate 253 depending on whether or not the decreased peak value time is longer than a certain amount of time. The detection signal aPON is configured to a low level, for example, when the decreased peak value time is longer than a certain amount of time, and configured to a high level when this condition is not met.

The state machine circuit 242 generates a detection signal sPON at a low level when any of the time duration when positive charge has high voltage, the time duration when negative charge has high voltage, and time duration when both charges have low voltage are longer than a certain amount of time, and generates the detection signal sPON at a high level when this condition is not met. The state machine circuit 242 supplies the generated detection signal sPON to the AND gate 253.

The AND gate 253 outputs the logical product of the input values. The detection signal sPON and aPON are input into this AND gate 253. The AND gate 253 supplies the detection signal PON, which is the logical product of these values, to the photocoupler 320.

Such a configuration enables the detection of an interruption in the supply of alternating current power when the decreased peak value time is longer than a certain amount of time, or when any of the time duration when positive charge has high voltage, the time duration when negative charge has high voltage, and time duration when both charges have low voltage are longer than the timeout time.

FIG. 20 is a block diagram of an example of the power interruption detection circuit 240. The power interruption detection circuit 240 includes operations for a peak value monitoring unit 254 and a power supply interruption detection unit 255 in place of the power supply interruption detection unit 247.

The peak value monitoring unit 254 monitors the peak voltage of the pulsating current voltage VP and VN produced from the half-wave rectification of the alternating current voltage ACIN, and detects whether or not this value has become lower than the reference voltage Vref2. This peak value monitoring unit 254 generates the detection signal aPON depending on whether or not the decreased peak value time is longer than a certain amount of time, and supplies this to the power supply interruption detection unit 255. Further, the peak value monitoring unit 254 is an example of a determination unit as disclosed herein.

The power supply interruption detection unit 255 detects an interruption in the supply of alternating current power when the decreased peak value time is longer than a certain amount of time, or when any of the time duration when positive charge has high voltage, the time duration when negative charge has high voltage, and time duration when both charges have low voltage are longer than the timeout time.

The operations of the peak value monitoring unit 254 in FIG. 20 may be achieved by the peak value monitoring circuit 251 and the decreased peak value time counter 252 in FIG. 19. Also, the operations of the power supply interruption detection unit 255 in FIG. 20 may be achieved by the state machine circuit 242 and the AND gate 253 in FIG. 19.

"Operational Example of Power Supply Interruption Detection Circuit"

FIG. 21 is a flowchart illustrating example operations of the power supply monitoring circuit 200. The power supply monitoring circuit 200 according to the second embodiment may also execute steps S903, S930, S904, and S905.

The power supply monitoring circuit 200 compares the positive charge pulsating current voltage VP and the reference voltage Vref1 (step S901), and compares the positive charge pulsating current voltage VP and the reference voltage Vref2 (step S903). Then, the power supply monitoring circuit 200 executes the power supply interruption detection processing (step S910). Also, the power supply monitoring circuit 200 compares the negative charge pulsating current voltage VN and the reference voltage Vref1 (step S902), and compares the negative charge pulsating current voltage VN and the reference voltage Vref2 (step S904). Then, the power supply monitoring circuit 200 executes the power supply interruption detection processing (step S910).

Then, the power supply monitoring circuit 200 executes a peak value monitoring processing to monitor the peak value of the positive charge and the negative charge (step S930). The power supply monitoring circuit 200 determines whether or not either the detection signal sPON or the detection signal aPON are at a low level (step S905). When either the detection signal sPON or the detection signal aPON is at a low level (Yes in step S905), the power supply monitoring circuit 200 detects an interruption in the supply of alternating current power, and outputs the detection signal PON at a high level (step S906). After step S906, or when both the detection signal sPON and the detection signal aPON are at a high level (No in step S905), the power supply monitoring circuit 200 returns to step S901.

FIG. 22 is a flowchart illustrating an example of the power supply interruption detection processing. The power supply interruption detection processing according to the second embodiment may execute steps S921, S922, S923, and S924 in place of steps S912, S915, S918, and S920.

When both the pulsating current voltage VP and the pulsating current voltage VN are both less than the reference voltage Vref1 (Yes in step S911), the power interruption detection circuit 240 outputs the detection signal sPON at a high level instead of the detection signal PON (step S921).

When only the pulsating current voltage VP is higher than the reference voltage Vref1 (Yes in step S914), the power interruption detection circuit 240 outputs the detection signal sPON at a high level instead of the detection signal PON (step S922).

When only the pulsating current voltage VN is higher than the reference voltage Vref1 (Yes in step S917), the power interruption detection circuit 240 outputs the detection signal sPON at a high level instead of the detection signal PON (step S923).

When any of the normal state when positive charge has high voltage, the normal state when negative charge has high voltage, and normal state when both charges have low voltage are longer than a certain amount of time, the power interruption detection circuit 240 detects an abnormal state. Then, the power interruption detection circuit 240 outputs the detection signal sPON at a low level (step S924). Next, the power interruption detection circuit 240 determines whether or not the pulsating current voltage VP and the pulsating current voltage VN are at or below the reference voltage Vref1 (step S927). When the pulsating current voltage VP or voltage VN is higher than the reference voltage Vref1 (No in step S927), the power interruption detection circuit 240 returns to step S927. When the pulsating current voltage VP and the voltage VN are at or below the reference voltage Vref1 (Yes in step S927), the power interruption detection circuit 240 transitions to the abnormal state when both charges have low voltage. The power interruption detection circuit 240 determines whether or not only the pulsating current voltage VN has become higher than the reference voltage Vref1 during this abnormal state when both charges have low voltage (step S928). When only the pulsating current voltage VN has become larger than the reference voltage Vref1 (Yes in step S928), the power interruption detection circuit 240 returns to step S923). When only the pulsating current voltage VN has not become higher than the reference voltage Vref1 (No in step S928), the power interruption detection circuit 240 determines whether or not only the pulsating current voltage VP has become higher than the reference voltage Vref1 (step S929). When only the pulsating current voltage VP has become higher than the reference voltage Vref1 (Yes in step S929), the power interruption detection circuit 240 returns to step S922). When the pulsating current voltage VP and VN has not become higher than the reference voltage Vref1 (No in step S929), the power interruption detection circuit 240 returns to step S928.

FIG. 23 is a flowchart illustrating an example of the peak value monitoring processing. The power interruption detection circuit 240 determines whether or not the peak voltage is less than the reference voltage Vref2, based on the comparison result A_high, which is the XOR comparison result between the positive charge pulsating current voltage VP or the negative charge pulsating current voltage VN with the reference voltage Vref2 (step S931). For a period when the peak voltage for either the positive charge or the negative charge is at or above the reference voltage Vref2 (No in step S931), the power interruption detection circuit 240 resets the decreased peak value time counter 252 to an initial value (zero, for example), and terminates the peak value monitoring processing. Further, if the peak voltage of either the positive charge, or the negative charge is less than the reference voltage Vref2 (Yes in step S931), the power interruption detection circuit 240 increments the value from the decreased peak value time counter 252. The power interruption detection circuit 240 counts the time until the peak voltage of either the positive charge or the negative charge again reaches the reference voltage Vref2 from the values of the decreased peak value time counter 252 (step S932). The power interruption detection circuit 240 determines whether or not the count value of the decreased peak value time counter 252 is over a certain value (step S933).

When the count value is over the certain value (Yes in step S933), the power interruption detection circuit 240 detects that the peak value of either the positive charge or the negative charge has decreased below the reference voltage Vref2, and outputs the detection signal aPON at a low level (step S934). When the count value is at or below the certain value (No in step S933), or after step S934, the power interruption detection circuit 240 terminates the peak value monitoring processing.

FIG. 24 is a timing chart illustrating example operations of the power supply monitoring circuit when the peak value is decreased. This timing chart illustrates examples of changes as time progresses for the pulsating current voltage VP, the pulsating current voltage VN, the comparison result P_high, the comparison result N_high, the state of the state machine circuit 242, the comparison result A_high, and the detection signal PON.

In the case where the peak value of the pulsating current voltage VN during some positive charge period is at or above the reference voltage Vref2, but during the next negative charge period, the peak value of the pulsating current voltage VN has fallen below the reference voltage Vref2. In this case, as illustrated in FIG. 25, the pulsating current voltage VP rises to or above the reference voltage Vref2 during a certain period of time during the positive charge period, and the comparison result A_high changes to a high level. If the pulsating current voltage VP falls below the reference voltage Vref2 during the positive charge period, the comparison result A_high changes to a low level. If the peak value is less than the reference voltage Vref2 during the negative charge period, the comparison result A_high remains at a low level. For this reason, when a certain amount of time passes after the comparison result A_high changes to a low level, the power interruption detection circuit 240 detects an interruption in the supply of alternating current power, and outputs the detection signal PON at a low level.

Further, as the time duration for the normal state when positive charge has high voltage, the normal state when negative charge has high voltage, and the normal state when both charges have low voltage are within the timeout time, the state machine circuit 242 does not transition to an abnormal state.

According to the second embodiment of the disclosed, in this way, the power supply monitoring circuit 200 may detect interruptions in the supply of alternating current power when the peak value is less than the reference voltage Vref2. As a result, when the peak value is less than the reference voltage Vref2, even though the time duration of the various state are within the timeout time, interruptions in the supply of the alternating current power are reliably detected without failures in the detections of interruptions in the supply of alternating current power.

Third Embodiment

"Configuration Example of Power Supply Interruption Detection Circuit"

FIG. 25 is a block chart illustrating an example of the power interruption detection circuit 240. According the first embodiment, the power interruption detection circuit 240 obtains only the time duration for the state at which either the positive charge or negative charge pulsating current voltage rises above the reference voltage Vref1, and the time duration for the state at which both the positive and negative charge pulsating current is at or below the reference voltage Vref1.

If there is a large capacitance in the wiring path to which the pulsating current voltage VP and VN are applied, the pulsating current voltage VP and VN cross at a voltage at or above the reference voltage Vref1, and at this point in time, the supply of alternating current power is interrupted. In this case, there may be times when both the positive charge and negative charge of the pulsating current may be higher than the reference voltage Vref1 longer than a certain time. Preferably, the power interruption detection circuit 240 further obtains the time duration for this state, and thus detects interruptions in the supply of power more quickly. The power supply monitoring circuit 200 quickly detects interruptions in the supply of alternating current power even when the waves of pulsating current voltage VP and VN partially overlap due to the effects of capacitance, etc., and the supply of alternating current power is interrupted during such overlapping intervals. For example, the power interruption detection circuit 240 includes a both-charges high-voltage time duration obtaining unit 261 and a power supply interruption detection unit 262 in place of the power supply interruption detection unit 247.

The both-charges high-voltage time duration obtaining unit 261 obtains a time duration when both charges have high voltage, which is the time that a state at which the both the positive and negative charge pulsating current voltage VP and VN are higher than the reference voltage Vref1 continues. The both-charges high-voltage time duration obtaining unit 261 supplies the time duration when both charges have high voltage to the power supply interruption detection unit 262.

The power supply interruption detection unit 262 detects an interruption in the supply of alternating current power when any of the time duration when positive charge has high voltage, the time duration when negative charge has high voltage, the time duration when both charges have low voltage, and the time duration when both charges have high voltage are longer than the predetermined timeout time. The timeout time for the time duration when both charges have high voltage is configured to 6.2 milliseconds, for example.

The operations of the both-charges low-voltage time duration obtaining unit 246 in FIG. 25 may be achieved by the state machine circuit 242 and the state time duration counter 243 in FIG. 6. Also, the operations of the power supply interruption detection unit 262 in FIG. 25 may be achieved by the state machine circuit 242 in FIG. 6.

"Operational Example of Power Supply Interruption Detection Circuit"

FIG. 26 is a chart of transitional states illustrating example operations of the state machine circuit 242. The normal states of the state machine circuit 242 further include a normal state when both charges have high voltage 608, and the abnormal states include an abnormal state when both charges have high voltage 609.

When the comparison result P_high and comparison result N_high both change to a high level during the initial state 601, normal state when both charges have low voltage 602, normal state when positive charge has high voltage 603, and normal state when negative charge has a high voltage 604, the state machine circuit 242 transitions to the normal state when both charges have high voltage 608. When both the comparison result P_high and the comparison result N_high are at a high level during this normal state when both charges have high voltage 608, the state machine circuit 242 maintains the normal state when both charges have high voltage 608. When the normal state when both charges have high voltage 608 continues for longer than the predetermined timeout time (6.2 milliseconds, for example), the state machine circuit 242 transitions to the abnormal state when both charges have high voltage 609.

Also, when both the comparison result N_high and the comparison result P_high change to low level during the normal state when both charges have high voltage 608, the state machine circuit 242 transitions to the normal state when both charges have low voltage 602. When only the comparison result N_high changes to a low level during the normal state when both charges have high voltage 608, the state machine circuit 242 transitions to the normal state when positive charge has high voltage 603. Further, when only the comparison result P_high changes to a low level during the normal state when both charges have high voltage 608, the state machine circuit 242 transitions to the normal state when negative charge has a high voltage 604.

When both the comparison result P_high and the comparison result N_high are at a high level during an abnormal state when both charges have high voltage 609, the state machine circuit 242 maintains the abnormal state when both charges have high voltage 609. Also, when both the comparison result P_high and comparison result N_high change to a low level during the abnormal state when both charges have high voltage 609, the state machine circuit 242 transitions to the abnormal state when both charges have low voltage 605.

Further, the abnormal state when positive charge has high voltage 606 and the abnormal state when negative charge has high voltage 607 are omitted from FIG. 26. Also, the transition conditions for states other than for the normal state when both charges have high voltage 608 and the abnormal states include an abnormal state when both charges have high voltage 609 are also omitted. The omitted transition conditions are the same as those regarding the first embodiment.

FIG. 27 is a flowchart illustrating an example of the power supply interruption detection processing. The power supply interruption detection processing according to the third embodiment executes steps S925, S926, and S940.

When only the pulsating current voltage VN becomes higher than the reference voltage Vref1, e.g., when the pulsating current voltage VP the pulsating current voltage VN are higher than the reference voltage Vref1 (No in step S917), the power interruption detection circuit 240 transitions to the normal state when both charges have high voltage. Then, the power interruption detection circuit 240 uses the state time duration counter 243 to count the time duration of this state. If this is a transfer from another state, the power interruption detection circuit 240 resets the count value of the state time duration counter 243 to an initial value before starting the count. Also, the power interruption detection circuit 240 outputs the detection signal PON at a high level. Then, the power interruption detection circuit 240 determines whether or not the normal state when both charges have high voltage continues for longer than 6.2 milliseconds (step S926). When the time duration for the normal state when both charges have high voltage is not longer than 6.2 milliseconds (No in step S926), the power interruption detection circuit 240 returns to step S911.

When any of the normal state when both charges have low voltage, the normal state when positive charge has high voltage, the normal state when negative charge has high voltage, and the normal state when both charges have high voltage continue for longer than a certain amount of time (Yes in steps S913, S916, S919, or S926), the power interruption detection circuit 240 executes step S920. Then, the power interruption detection circuit 240 determines whether or not the pulsating current voltage VP and VN are at or below the reference voltage Vref1 (step S927). When either the pulsating current voltage VP or VN are higher than the reference voltage Vref1 (No in step S927), the power interruption detection circuit 240 returns to step S927. When the pulsating current voltage VP and VN are at or below the reference voltage Vref1 (Yes in step S927), the power interruption detection circuit 240 transitions to the abnormal state when both charges have low voltage. The power interruption detection circuit 240 determines whether or not only the pulsating current voltage VN has become higher than the reference voltage Vref1 during this abnormal state when both charges have low voltage (step S928). When only the pulsating current voltage VN has become higher than the reference voltage Vref1 (Yes in S928), the power interruption detection circuit 240 returns to step S918. When only the pulsating current voltage VN has not become higher than the reference voltage Vref1 (No in step S928), the power interruption detection circuit 240 determines whether or not only the pulsating current voltage VP has become higher than the reference voltage Vref1 (step S929). When only the pulsating current voltage VP has become higher than the reference voltage Vref1 (Yes in S929), the power interruption detection circuit 240 returns to step S915. When only the pulsating current voltage VP has not become higher than the reference voltage Vref1 (No in step S929), the power interruption detection circuit 240 determines whether or not the pulsating current voltage VP and VN have become higher than the reference voltage Vref1 (step S940). When the pulsating current voltage VP and VN have become higher than the reference voltage Vref1 (Yes in step S940), the power interruption detection circuit 240 returns to step S925. When the pulsating current voltage VP and VN have not become higher than the reference voltage Vref1 (No in step S940), the power interruption detection circuit 240 returns to step S928.

FIG. 28 is a timing chart illustrating example operations of the power supply monitoring circuit during an interruption of the power supply. This timing chart illustrates changes that occur over time regarding the positive charge pulsating current voltage VP, the negative charge pulsating current voltage VN, the comparison result P_high, the comparison result N_high, the state machine circuit 242, and the detection signal PON.

In one example, the peak of the pulsating voltage is higher than the reference voltage Vref1, and that the supply of alternating current power has been interrupted at a timing when the pulsating current voltage VP and VN cross. In this example, as both the pulsating current voltage VP and VN are higher than the reference voltage Vref1 directly after the supply of alternating current power has been interrupted, the comparison result P_high and comparison result N_high both change to a high level. As a result, the state machine circuit 242 transitions to the normal state when both charges have high voltage. Also, when the pulsating current voltage VP and VN decrease and the timeout time expires, the state machine circuit 242 transitions to the abnormal state when both charges have high voltage, and detects an interruption in the supply of alternating current power.

As illustrated in FIG. 28, the power interruption detection circuit 240 may quickly detect interruptions in the supply of alternating current power even during cases when the supply of alternating current power is interrupted at a timing when the pulsating current voltage VP and VN cross.

According to the third embodiment, in this way, the power supply monitoring circuit 200 may detect whether or not the supply of alternating current power has been interrupted by whether or not the time duration of a state at which the peak voltage for both the positive charge and the negative charge of the pulsating current voltage are higher than the reference voltage is longer than within the time of the alternating current voltage cycle. As a result, interruptions in the supply of alternating current voltage may be detected during a time shorter than a cycle of the alternating current power even for cases when the supply of alternating current power is interrupted at a timing when the pulsating current voltage VP and VN cross at a voltage higher than the reference voltage Vref1, and there is a large capacitance on the wiring path to which the pulsating current is applied.

Further, the previously described embodiments only serve to illustrate examples of carrying out the disclosed, and the content of the embodiments and the content regarding the features of the technology in the claims have a corresponding relationship. Similarly, the contents regarding the features of the technology in the claims that have the same reference numerals as the content regarding the embodiments of the disclosed have a corresponding relationship. However, the disclosed is not restricted to the content of these embodiments, and various modifications, sub-combinations, and alterations may occur insofar as they are within the scope of the appended claims or the equivalents thereof.

It should be noted that the present disclosure may also take the following configurations:

(1) A power supply monitoring device includes:
a time duration obtaining unit configured to obtain a time duration of a time in which a value of an alternating current processed with half-wave rectification continues to be higher than a predetermined reference value; and a power supply interruption detection unit configured to detect whether or not the supply of alternating current power has been interrupted by whether or not the time duration is longer than a power supply interruption determination time, which is shorter than a cycle of the alternating current.

(2) The power supply monitoring device according to (1), further including: a positive-charge high-voltage time duration obtaining unit configured to obtain a time duration when the positive charge has a high voltage, which is the time of a state at which a value of the positive voltage of the alternating current or a value of the positive alternating current which has been processed by half-wave rectification continues to be higher than the reference value; and a negative-charge high-voltage time duration obtaining unit configured to obtain a time duration when the negative charge has a high voltage, which is the time of a state at which a value of the negative voltage of the alternating current or a value of the negative alternating current which has been processed by half-wave rectification continues to be higher than the reference value; wherein the power supply interruption detection unit detects whether or not the supply of alternating current power has been interrupted by whether or not the time duration when positive charge has high voltage is longer than the power supply interruption determination time during a period in which the time duration when positive charge has high voltage is being obtained, and also detects whether or not the supply of alternating current power has been interrupted by whether or not the time duration when negative charge has high voltage is longer than the power supply interruption determination time during a period in which the time duration when negative charge has high voltage is being obtained.

(3) The power supply monitoring device according to (2), further including a both-charges low-voltage time duration obtaining unit configured to obtain a time duration when both charges have a low voltage, which is the time of a state at which a value of the positive and negative voltage of the alternating current or a value of the positive and negative alternating current which has been processed by half-wave rectification continues to not be higher than the reference value; wherein the power supply interruption detection unit detects whether or not the supply of alternating current power has been interrupted by whether or not the time duration when both charges have low voltage is longer than a both-charges low-voltage determination time during a period in which the time duration when both charges have low voltage is being obtained.

(4) The power supply monitoring device according to either (2) or (3), further including: a both-charges high-voltage time duration obtaining unit configured to obtain a time duration when both charges have a high voltage, which is the time of a state at which a value of the positive and negative voltage of the alternating current or a value of the positive and negative alternating current which has been processed by half-wave rectification continues to be higher than the reference value; wherein the power supply interruption detection unit detects whether or not the supply of alternating current power has been interrupted by whether or not the time duration when both charges have high voltage is longer than a both-charges high-voltage determination time during a period in which the time duration when both charges have high voltage is being obtained.

(5) The power supply monitoring device according to any one of (1) through (4), further including: a determination unit configured to determine whether or not a maximum value of the alternating current which has been processed by half-wave rectification is lower than a predetermined value; wherein the power supply interruption detection unit detects that the supply of alternating current power has been interrupted when the maximum value is less than the predetermined value, or when the time duration is longer than the power supply interruption detection time.

(6) The power supply monitoring device according to any one of (1) through (5), further including: a comparing unit configured to compare the value of alternating current which has been processed with half-wave rectification and the reference value; wherein the time duration obtaining unit obtains the time duration on the basis of a comparison result between the value of alternating current which has been processed with half-wave rectification and the reference value.

(7) An AC/DC converting device including: an AC/DC converter unit configured to convert alternating current into direct current; a half-wave rectification unit configured to perform half-wave rectification on the alternating current; a time duration obtaining unit configured to obtain a time duration, which is a time of a state at which a value of the alternating current which has been processed with half-wave rectification continues to be higher than a predetermined reference value; and a power supply interruption detection unit configured to detect whether or not the supply of alternating current power has been interrupted by whether or not the time duration is longer than a power supply interruption determination time, which is shorter than a cycle of the alternating current.

(8) A method to control a power supply monitoring device includes: time duration obtaining, in which a time duration obtaining unit obtains a time of a state at which a value of the alternating current which has been processed with half-wave rectification continues to be higher than a predetermined reference value, as a time duration; and power supply interruption detecting, in which a power supply interruption detection unit detects whether or not the supply of alternating current power has been interrupted, by whether or not the time duration is longer than a power supply interruption determination time, which is shorter than a cycle of the alternating current.

(9) A power supply monitoring device, comprising:
a monitoring circuit that includes
a first charge comparing unit configured to generate a first comparison result based on a first pulsating signal,
a second charge comparing unit configured to generate a second comparison result based on a second pulsating signal, and a power interruption detection unit configured to output a detection signal based on whether the first and second comparison results indicate a supply of power has been interrupted.

(10) The device of (9), wherein the power interruption detection unit changes the detection signal when the first and second comparison results are in at least one of a set of states that continues for a period longer than a predetermined timeout period.

(11) The device of (10), wherein the power interruption detection unit changes the detection signal when a third comparison result or a fourth comparison result is in a low state, the third comparison result being output from the first charge comparing unit and the fourth comparison result being output from the second charge comparing unit.

(12) The device of (10), wherein the first charge comparing unit outputs a third comparison result based on the first pulsating signal and a reference voltage, and the second charge comparing unit outputs a fourth comparison result based on the second pulsating signal and the reference voltage.

(13) The device of (10), wherein the set of states includes:
a first state that is when the first comparison result is high and the second comparison result is low;
a second state that is when the second comparison result is high and the first comparison result is low; and
a third state that is when the first and second comparison results are low.

(14) The device of (13), wherein the predetermined timeout period for the first and second states is a first time duration and for the third state is a second time duration.

(15) The device of (13), wherein the set of states includes:
a fourth state that is when the first comparison result is high and the second comparison result is high.

(16) The device of (9), wherein the first charge comparing unit generates the first comparison result based on comparing the first pulsating signal to a reference voltage, where the first comparison result is high when the first pulsating signal is greater than the reference voltage and low when the first pulsating signal is lower than the reference voltage; and
wherein the second charge comparing unit generates the second comparison result based on comparing the second pulsating signal to the reference voltage, where the second comparison result is high when the second pulsating signal is greater than the reference voltage and low when the second pulsating signal is lower than the reference voltage.

(17) The device of (9), further comprising:
a half-wave rectifier unit configured to generate the first and second pulsating signals respectively from a positive voltage and a negative voltage of an alternating current voltage.

(18) The device of (17), wherein the predetermined timeout is configured to be shorter than a cycle of an alternating current voltage.

(19) The device of (9), further comprising:
a half-wave rectifier unit configured to generate the first and second pulsating signals respectively from a positive current and a negative current of an alternating current voltage.

(20) The device of (9), wherein the first pulsating signal is an analog pulsating signal, and
the first charge comparing unit performs conversion on the analog pulsating voltage to generate a converted voltage and compares the converted voltage and a reference voltage to generate the first comparison result.

(21) The device of (9), further comprising:
a converter unit configured to generate an output voltage based on a full-wave rectification of an input voltage.
(22) An electronic apparatus comprising the device of (9).
(23) A power supply monitoring method, comprising:
generating a first comparison result based on a first pulsating signal,
generating a second comparison result based on a second pulsating signal, and
outputting a detection signal based on whether the first and second comparison results indicate a supply of power has been interrupted.
(24) The method of (23), further comprising:
changing the detection signal when the first and second comparison results are in at least one of a set of states that continues for a period longer than a predetermined timeout period.
(25) The method of (24), further comprising:
changing the detection signal when a third comparison result or a fourth comparison result is in a low state,
the third comparison result being output based on a comparison between the first pulsating signal and a reference voltage, and
the fourth comparison result being output based on a comparison between the second pulsating signal and the reference voltage.
(26) The method of (24), wherein the set of states includes:
a first state that is when the first comparison result is high and the second comparison result is low;
a second state that is when the second comparison result is high and the first comparison result is low; and
a third state that is when the first and second comparison results are low.
(27) The method of (26), wherein the predetermined timeout period for the first and second states is a first time duration and for the third state is a second time duration.
(28) The method of (26), wherein the set of states includes:
a fourth state that is when the first comparison result is high and the second comparison result is high.

The present disclosure contains subject matter related to that disclosed in Japanese Priority Patent Application JP 2012-195356 filed in the Japan Patent Office on Sep. 5, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 AC/DC converter
110 AC/DC converter unit
120 rectifier circuit
121, 122, 123, 124, 151, 161 diode
130 transformer circuit
131 Choke coil
132 Block condenser
140 half-wave rectifier unit
150 positive half-charge rectifier unit
152, 153, 162, 163 Resistor
160 negative half-wave rectifier unit
200 power supply monitoring circuit
210 positive charge comparing unit
211, 213, 221, 223 reference voltage supply source
212, 214, 222, 224 Comparator
220 negative charge comparing unit
230 OR gate
240 power interruption detection circuit
241 sampling circuit
242 state machine circuit
243 state time duration counter
244 positive-charge high-voltage time duration obtaining unit
245 negative-charge high-voltage time duration obtaining unit
246 both-charges low-voltage time duration obtaining unit
247, 255, 262 power supply interruption detection unit
251 peak value monitoring circuit
252 decreased peak value time counter
253 AND gate
254 peak value monitoring unit
261 both-charges high-voltage time duration obtaining unit
310 DC/DC converter
320 photocoupler
400 electrical device

The invention claimed is:

1. A power supply monitoring device, comprising:
time duration obtaining circuitry configured to determine a time duration for which a value of a pulsating signal is higher than a first predetermined reference voltage; and
power interruption detection circuitry configured to determine whether a supply of power has been interrupted based on whether or not the time duration is longer than a first threshold time duration,
wherein the pulsating signal is an alternating current signal processed with half-wave rectification, and the first threshold time duration is shorter than a period of the alternating current signal.

2. The device of claim 1, wherein the time duration obtaining circuitry includes:
positive charge time duration obtaining circuitry configured to determine a positive time duration for which a value of a positive voltage of the pulsating signal or a value of a positive part of the alternating current signal is higher than the first predetermined reference voltage; and
negative charge time duration obtaining circuitry configured to determine a negative time duration for which a value of the negative voltage of the pulsating signal or a value of a negative part of the alternating current signal is higher than the first predetermined reference voltage,
wherein the power supply interruption detection circuitry is configured to determine whether the supply of power has been interrupted based on whether or not the positive time duration or the negative time duration is longer than the first threshold time duration.

3. The device of claim 2, wherein the time duration obtaining circuitry includes:
dual low charge time duration obtaining circuitry configured to determine a dual low time duration for which the value of the positive voltage of the pulsating signal and the value of the negative voltage of the pulsating signal, or the value of the positive part of the alternating current signal and the value of the negative part of the alternating signal, are lower than or equal to the first predetermined reference voltage, wherein the power supply interruption detection circuitry is configured to determine whether the supply of power has been interrupted based on whether or not the dual low time duration is longer than a second threshold time duration.

4. The device of claim 2, wherein the time duration obtaining circuitry includes:
dual high charge time duration obtaining circuitry configured to determine a dual high time duration for which the value of the positive voltage of the pulsating signal and the value of the negative voltage of the pulsating signal, or the value of the positive part of the alternating current signal and the value of the negative part of the alternating signal, are higher than the first predetermined reference voltage,
wherein the power supply interruption detection circuitry is configured to determine whether the supply of power has been interrupted based on whether or not the dual high time duration is longer than the first threshold time duration.

5. An electronic apparatus comprising:
AC/DC converter circuitry configured to convert the alternating current signal into a direct current;
half-wave rectification circuitry configured to perform the half-wave rectification on the alternating signal; and
the power supply monitoring device of claim 1.

6. The device of claim 1, further comprising:
determination circuitry configured to determine whether or not a maximum value of the pulsating signal is lower than a second predetermined reference voltage,
wherein the power supply interruption detection circuitry is configured to determine that the supply of power has been interrupted when the maximum value is lower than the second predetermined reference voltage or when the time duration is longer than the first threshold time duration.

7. The device of claim 1, further comprising:
comparison circuitry configured to compare the value of the first pulsating signal and the first predetermined voltage,
wherein the time duration obtaining circuitry is configured to determine the time duration based on a result of the comparison by the comparison circuitry.

8. A power supply monitoring method, comprising:
determining, by time duration obtaining circuitry, a time duration for which a value of a pulsating signal is higher than a predetermined reference voltage; and
determining, by power interruption detection circuitry, whether a supply of power has been interrupted based on whether or not the time duration is longer than a first threshold time duration,
wherein the pulsating signal is an alternating current signal processed with half-wave rectification, and the first threshold time duration is shorter than a period of the alternating current signal.

9. The method of claim 8, wherein the determining the time duration includes:
determining, by positive charge time duration circuitry, a positive time duration for which a value of a positive voltage of the pulsating signal or a value of a positive part of the alternating current signal is higher than the first predetermined reference voltage; and
determining, by negative charge time duration circuitry, a negative time duration for which a value of a negative voltage of the pulsating signal or a value of a negative part of the alternating current signal is higher than the first predetermined reference voltage,
wherein the determining whether the supply of power has been interrupted is based on whether or not the positive time duration or the negative time duration is longer than the first threshold time duration.

10. The method of claim 9, wherein the determining the time duration includes:
determining, by dual low charge time duration circuitry, a dual low time duration for which the value of the positive voltage of the pulsating signal and the value of the negative voltage of the pulsating signal, or the value of the positive part of the alternating current signal and the value of the negative part of the alternating signal, are lower than or equal to the first predetermined reference voltage,
wherein the determining whether the supply of power has been interrupted is based on whether or not the dual low time duration is longer than a second threshold time duration.

11. The method of claim 9, wherein the determining the time duration includes:
determining, by dual high charge time duration circuitry, a dual high time duration for which the value of the positive voltage of the pulsating signal and the value of the negative voltage of the pulsating signal, or the value of the positive part of the alternating current signal and the value of the negative part of the alternating signal, are higher than the first predetermined reference voltage,
wherein the determining whether the supply of power has been interrupted is based on whether or not the dual high time duration is longer than the first threshold time duration.

12. The method of claim 8, further comprising:
determining, by determination circuitry, whether or not a maximum value of the pulsating signal is lower than a second predetermined reference voltage,
wherein the determining whether the supply of power has been interrupted is based on whether the maximum value is lower than the second predetermined reference voltage or whether the time duration is longer than the first threshold time duration.

13. The method of claim 8, further comprising:
comparing, by comparison circuitry, the value of the first pulsating signal and the first predetermined voltage,
wherein the determining the time duration is based on a result of the comparing.

* * * * *